(12) United States Patent
Song et al.

(10) Patent No.: US 12,213,352 B2
(45) Date of Patent: Jan. 28, 2025

(54) DISPLAY DEVICE INCLUDING A LOWER METAL LINE OVERLAPPING DRIVING TRANSISTOR OR SWITCHING TRANSISTOR TO MINIMIZE CROSSTALK

(71) Applicant: SAMSUNG DISPLAY CO., LTD., Yongin-si (KR)

(72) Inventors: Hee Rim Song, Seoul (KR); Hae Min Kim, Gumi-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 777 days.

(21) Appl. No.: 17/341,113

(22) Filed: Jun. 7, 2021

(65) Prior Publication Data

US 2021/0384284 A1    Dec. 9, 2021

(30) Foreign Application Priority Data

Jun. 8, 2020 (KR) .................. 10-2020-0069122

(51) Int. Cl.
| | | |
|---|---|---|
| *H10K 59/131* | (2023.01) | |
| *H01L 27/12* | (2006.01) | |
| *H10K 59/121* | (2023.01) | |
| *H10K 102/00* | (2023.01) | |

(52) U.S. Cl.
CPC ....... *H10K 59/131* (2023.02); *H10K 59/1213* (2023.02); *H01L 27/1214* (2013.01); *H10K 2102/311* (2023.02)

(58) Field of Classification Search
CPC ............. H10K 59/1213; H10K 59/131; H10K 2102/311; H01L 27/1214; H01L 27/124
USPC .......................................................... 257/72
See application file for complete search history.

(56) References Cited

U.S. PATENT DOCUMENTS

| | | |
|---|---|---|
| 9,559,124 B2 | 1/2017 | Park et al. |
| 10,128,317 B2 * | 11/2018 | Wacyk ................ H10K 59/131 |
| 10,263,060 B2 | 4/2019 | Noh et al. |
| 10,622,434 B2 | 4/2020 | Choi et al. |
| 2014/0319471 A1 | 10/2014 | Kim et al. |
| 2020/0212161 A1 * | 7/2020 | Choi .................... H10K 50/828 |

FOREIGN PATENT DOCUMENTS

KR     2017-0049705     5/2017

* cited by examiner

*Primary Examiner* — Matthew E. Gordon
(74) *Attorney, Agent, or Firm* — F. CHAU & ASSOCIATES, LLC

(57) ABSTRACT

A display device includes a display area including a plurality of pixels and a non-display area located around the display area. The display device further includes a base substrate, a lower metal line disposed on the base substrate and surrounding at least a portion of the display area in a plan view, and a gate layer disposed on the lower metal line. In the non-display area, the lower metal line does not overlap the gate layer.

25 Claims, 33 Drawing Sheets

DISPLAY DEVICE INCLUDING A LOWER METAL LINE OVERLAPPING DRIVING TRANSISTOR OR SWITCHING TRANSISTOR TO MINIMIZE CROSSTALK

CROSS-REFERENCE TO RELATED APPLICATION

This application claims priority under 35 U.S.C. § 119 to Korean Patent Application No. 10-2020-0069122, filed on Jun. 8, 2020 in the Korean Intellectual Property Office, the contents of which are herein incorporated by reference in its entirety.

TECHNICAL FIELD

The present disclosure relates to a display device and, more specifically, to a display device including a lower metal line.

DISCUSSION OF THE RELATED ART

Display devices are seeing widespread adoption in a variety of different products. For example, display devices are employed in various electronic devices such as smartphones, digital cameras, laptop/notebook computers, navigation devices, and smart televisions. These display devices are most commonly flat panel display device such as a liquid crystal display (LCD) devices, a field emission display devices, and a light emitting display device such as organic light emitting diode (OLED) displays.

SUMMARY

A display device includes a display area including a plurality of pixels and a non-display area located around the display area. The display device includes a base substrate, a lower metal line disposed on the base substrate and surrounding at least a portion of the display area in a plan view, and a thin film transistor disposed on the lower metal line and included in the plurality of pixels. The thin film transistor includes a channel, a first electrode, a second electrode, and a gate electrode overlapping the channel. The thin film transistor includes a driving transistor and a switching transistor. The lower metal line overlaps only one of a channel of the driving transistor and a channel of the switching transistor.

A display device includes a display area including a plurality of pixels and a non-display area located around the display area. The display device includes a base substrate, a lower metal line disposed on the base substrate and surrounding at least a portion of the display area in a plan view, and a gate layer disposed on the lower metal line. In the non-display area, the lower metal line does not overlap the gate layer.

BRIEF DESCRIPTION OF THE DRAWINGS

The above and other aspects and features of the present disclosure will become more apparent by describing in detail exemplary embodiments thereof with reference to the attached drawings, in which:

FIG. 21 is an enlarged view of area E4 of FIG. 21;

DETAILED DESCRIPTION OF THE EMBODIMENTS

Figure 1:
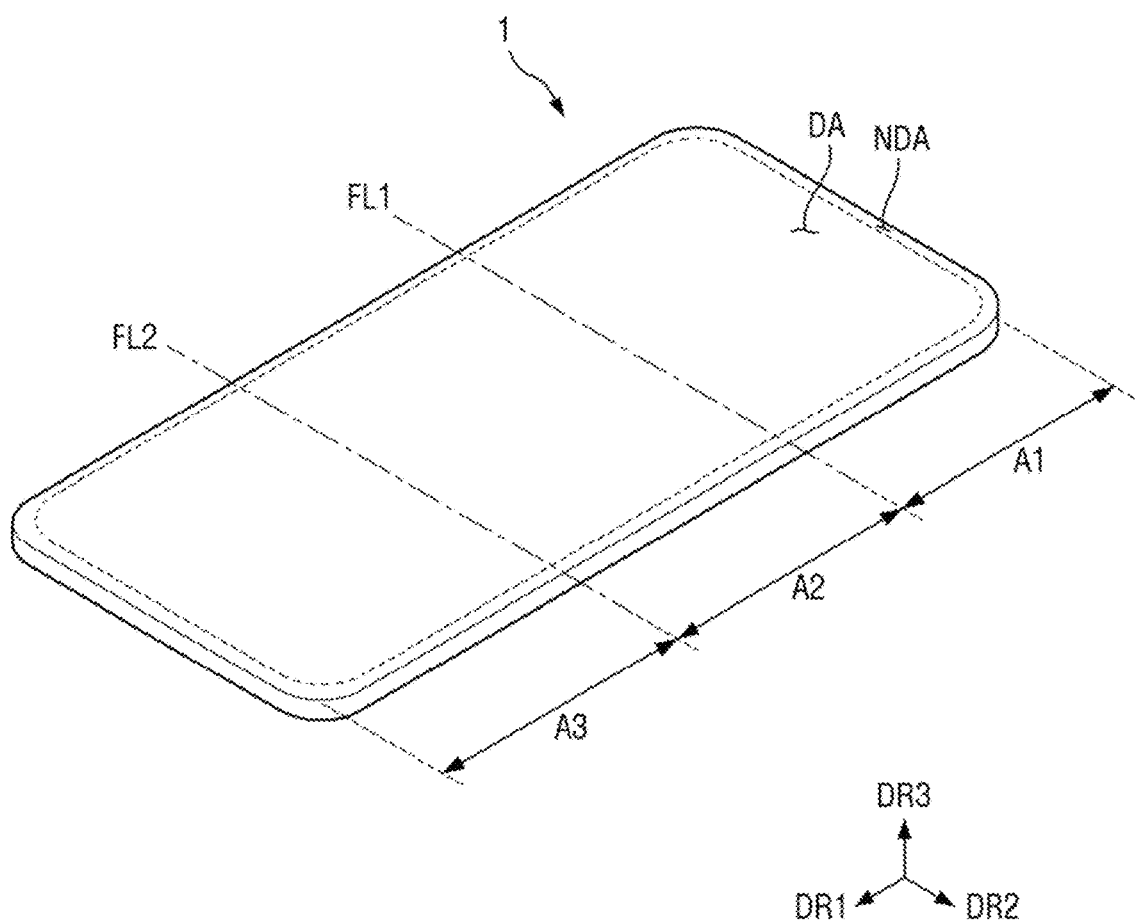
FIG. 1 is a perspective view illustrating a display device according to an exemplary embodiment of the present disclosure.

It will be understood that when an element is referred to as being related to another element such as being "coupled" or "connected" to another element, it can be directly coupled or connected to the other element or intervening elements may be present therebetween. Other expressions that explain the relationship between elements, such as "between" or "adjacent to" should be construed in the same way.

Throughout the specification, the same reference numerals may refer to the same or like parts.

It will be understood that, although the terms "first," "second," "third" etc. may be used herein to describe various elements, components, regions, layers and/or sections, these elements, components, regions, layers and/or sections should not necessarily be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as necessarily limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not necessarily limited to the precise shape of a region.

Figure 2:
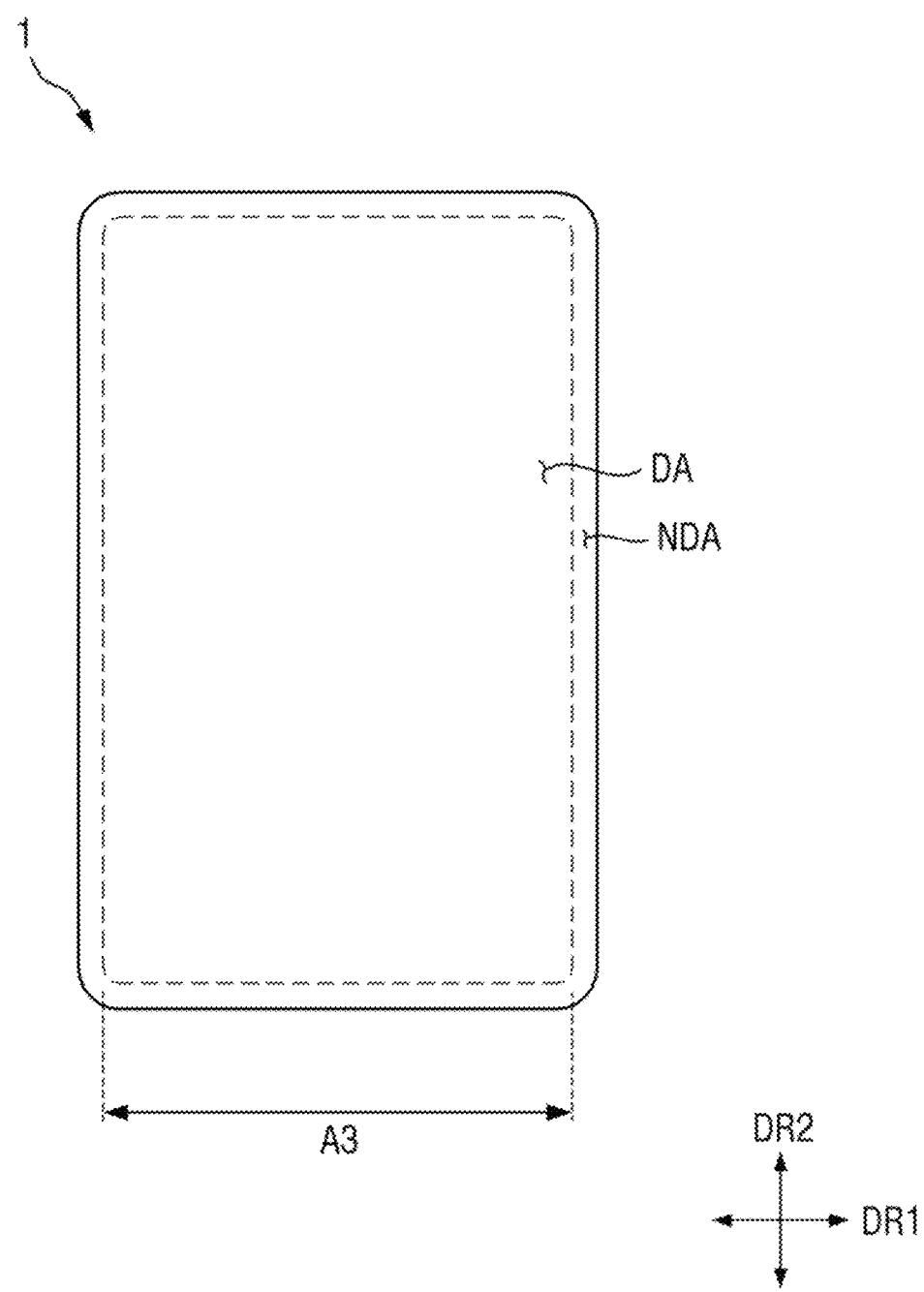
FIG. 2 is a plan view illustrating a folded state of a display device according to an exemplary embodiment of the present disclosure.
Figure 3:
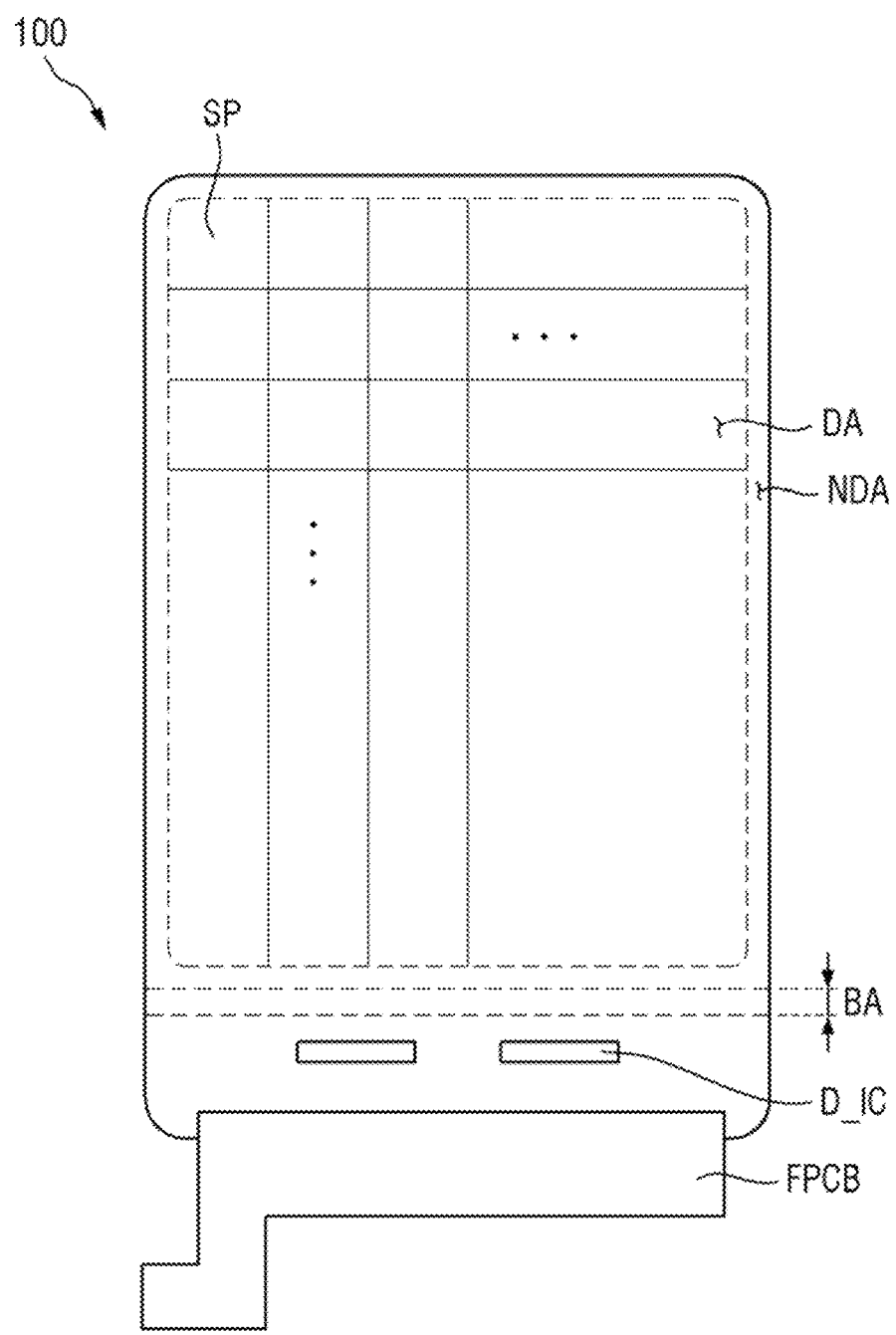
FIG. 3 is a plan view of a display panel according to an exemplary embodiment of the present disclosure.
Figure 4:
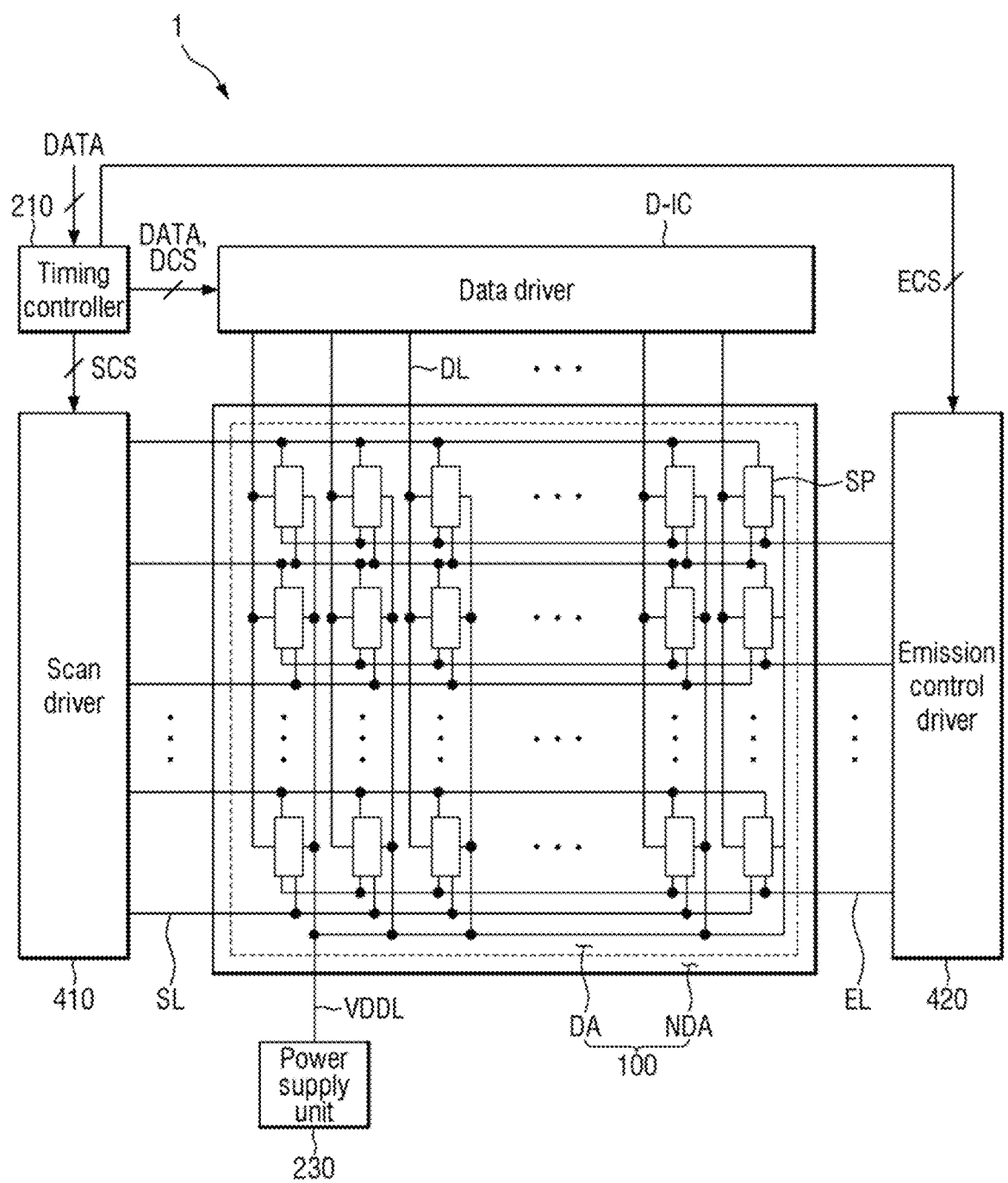
FIG. 4 is a block diagram illustrating a display device according to an exemplary embodiment of the present disclosure.

FIG. 1 is a perspective view illustrating a display device according to an exemplary embodiment of the present disclosure. FIG. 2 is a plan view illustrating a folded state of a display device according to an exemplary embodiment of the present disclosure. FIG. 3 is a plan view of a display panel according to an exemplary embodiment of the present disclosure. FIG. 4 is a block diagram illustrating a display device according to an exemplary embodiment of the present disclosure.

In the present specification, a second direction DR2 may be a direction parallel to a short side of a display device 1 in a plan view, for example, a horizontal direction of the display device 1. A first direction DR1 may be a direction parallel to a long side of the display device 1 in a plan view, for example, a vertical direction of the display device 1. A third direction DR3 may be a thickness direction of a display panel 100 of the display device 1.

Referring to FIGS. 1 to 4, the display device 1 is a device for displaying a moving image or a still image. The display device 1 may be used as a display screen of various devices, such as a television, a laptop/notebook computer, a computer monitor, a digital billboard, and/or an Internet-of-Things (IOT) device, as well as portable electronic devices such as a mobile phone, a smartphone, a tablet computer, a smart watch, a watch phone, a mobile communication terminal, an electronic notebook, an electronic book, a portable multimedia player (PMP), a navigation device, and/or an ultra-mobile PC (UMPC).

The display device 1 may be a light emitting display device such as an organic light emitting diode (OLED) display using an organic light emitting diode (OLED), a quantum dot light emitting display including a quantum dot light emitting layer, an inorganic light emitting display including an inorganic semiconductor, and/or a micro light emitting display using a micro light emitting diode (LED). In the following description, it is assumed that the display device 1 is an organic light emitting diode display device, but the present disclosure is not necessarily limited thereto.

The display device 1 includes a display panel 100, a display driving circuit D_IC, and a circuit board FPCB (e.g. a flexible printed circuit board).

The display panel 100 may have a rectangular shape, in a plan view, having a pair of short sides extending in the second direction DR2 and a pair of long sides extending in the first direction DR1 crossing the second direction DR2. The corner where the short side in the second direction DR2 and the long side in the first direction DR1 meet may be rounded to have a predetermined curvature or may be right-angled. The planar shape of the display panel 100 is not necessarily limited to a rectangular shape, and may be formed in other polygonal shapes, a circular shape or elliptical shape. The display panel 100 may be flat, but is not necessarily limited thereto. For example, the display panel 100 may include a curved portion formed at left and right ends and having a predetermined curvature or a varying curvature. In addition, the display panel 100 may be flexible such that it can be twisted, bent, folded, or rolled without sustaining damage.

The display device 1 may include a display area DA and a non-display area NDA located around the display area DA. A plurality of sub-pixels SP may be arranged in the display area DA. A sub-pixel SP might not be disposed in the non-display area NDA. The sub-pixels SP may be provided in the display area DA to display an image, but an image might not be displayed in the non-display area NDA. In addition to the sub-pixels SP, scan lines SL connected to the sub-pixels SP, light emitting lines EL, data lines DL, and first driving voltage lines VDDL may be arranged in the display area DA.

The scan lines SL and the light emitting lines EL may run parallel to each other in the second direction DR2. The data lines DL may run parallel to each other in the first direction DR1 crossing the second direction DR2.

The first driving voltage lines VDDL may be disposed in parallel in the first direction DR1 in the display area DA. The first driving voltage lines VDDL formed in parallel in the first direction DR1 in the display area DA may be connected to each other in the non-display area NDA. Alternatively, the first driving voltage lines VDDL may include first sub-driving voltage lines formed in parallel in the first direction DR1 in the display area DA and second sub-driving voltage lines formed in parallel in the second direction DR2.

Although it is illustrated that each of the sub-pixels SP is connected to two scan lines SL, one data line DL, one light emitting line EL, and the first driving voltage line VDDL, the present disclosure is not necessarily limited thereto. For example, each of the sub-pixels SP may be connected to three scan lines SL rather than two scan lines SL.

Figure 6:
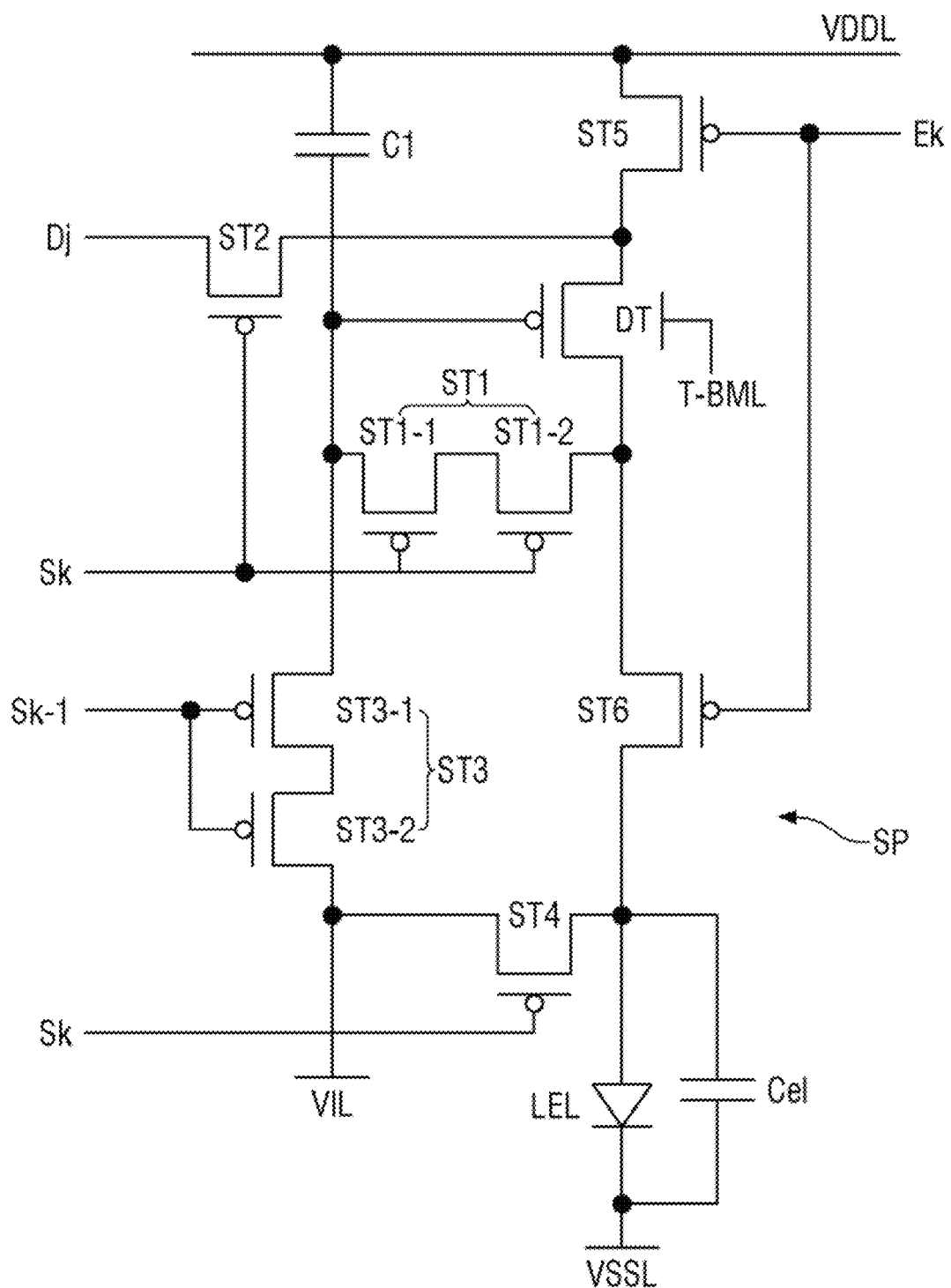
FIG. 6 is a circuit diagram specifically illustrating a sub-pixel according to an exemplary embodiment of the present disclosure.

As is shown in FIG. 6, each of the sub pixels SP may include a driving transistor DT, at least one transistor ST (e.g. ST1-ST6), a light emitting element LEL, and a capacitor (e.g. C1). The transistor ST may be turned on when a scan signal is applied from the scan line SL, and thus a data voltage of the data line DL may be applied to a gate electrode of the driving transistor DT. The driving transistor DT may emit light by supplying a driving current to the light emitting element LEL according to the data voltage applied to the gate electrode. The driving transistor DT and the at least one transistor ST may be thin film transistors. The light emitting element LEL may emit light according to the driving current of the driving transistor DT. The light emitting element LEL may be an organic light emitting diode (OLED) including a first electrode, an organic light emitting layer and a second electrode. The capacitor may serve to maintain the data voltage applied to the gate electrode of the driving transistor DT for a predetermined period.

The non-display area NDA may be defined as an area from the boundary of the display area DA to the edge of the display panel 100, although it may be possible for there to be a non-display area NDA within the display area DA. In the non-display area NDA, a scan driver (shown as element 410 in combination with element 420) for applying scan signals to the scan lines SL, and fan-out lines between the data lines DL and the display driving circuit D_IC, and first pads connected to the display driving circuit D_IC may be arranged. The first pads may be disposed in a first pad area. Further, second pads connected to the circuit board FPCB may be further included. The second pads may be disposed in a second pad area.

The first pad area and the second pad area may be disposed in the non-display area NDA.

The non-display area NDA may include a bending area BA. The bending area BA may extend along the second direction DR2. The bending area BA may be positioned closer to the display area DA than the display driving circuit D_IC in a plan view.

The scan driver may be connected to the display driving circuit D_IC through a plurality of scan control lines. The scan driver may receive a scan control signal SCS and an emission control signal ECS from the display driving circuit D_IC through the plurality of scan control lines.

The scan driver may include a scan signal output unit 410 and an emission signal output unit 420, as shown in FIG. 4. The scan signal output unit 410 may generate scan signals in response to the scan control signal SCS and sequentially output the scan signals to the scan lines SL. The emission signal output unit 420 may generate emission signals in response to the emission control signal ECS and sequentially output the emission signals to the light emitting lines EL.

The scan driver may include a plurality of thin film transistors. The scan driver may be disposed on the same layer as the thin film transistors of the sub-pixels SP. Alternatively, the scan driver may be disposed on a different layer from the thin film transistors of the sub-pixels SP.

The scan driver may be formed in the non-display area NDA on one side (e.g., the left side) of the display area DA, but is not necessarily limited thereto. For example, the scan driver may be formed in the non-display area NDA on both sides (e.g., the left and right sides) of the display area DA.

The display driving circuit D_IC may be formed as an integrated circuit (IC) and attached onto the display panel 100 by a chip on glass (COG) method, a chip on plastic (COP) method, or an ultrasonic bonding method, but the present disclosure is not necessarily limited thereto. For example, the display driving circuit D_IC may be attached on the circuit board FPCB in a chip on film (COF) manner. As shown in FIG. 4, the display driving circuit D_IC may include a timing controller 210, a data driver (shown as being within the display driving circuit D_IC), and a power supply unit 230.

The timing controller 210 receives digital video data and timing signals from the circuit board FPCB. In response to the timing signals, the timing controller 210 may generate the scan control signal SCS for controlling the operation timing of the scan signal output unit 410, the emission control signal ECS for controlling the operation timing of the emission signal output unit 420, and a data control signal DCS for controlling the operation timing of the data driver. The timing controller 210 may output the scan control signal SCS to the scan signal output unit 410 and output the emission control signal ECS to the emission signal output unit 420, through the plurality of scan control lines. The timing controller 210 may output the digital video data DATA and the data control signal DCS to the data driver.

The data driver converts the digital video data DATA into positive/negative analog data voltages and outputs them to the data lines DL through the fan-out lines. The sub-pixels SP are selected by the scan signals of the scan driver, and the data voltages are supplied to the selected sub-pixels SP.

The power supply unit 230 may generate a first driving voltage and supply the first driving voltage to the first driving voltage line VDDL. Further, the power supply unit 230 may generate a second driving voltage and supply the second driving voltage to a cathode electrode of the organic light emitting diode of each of the sub-pixels SP. The first driving voltage may be a high potential voltage or driving the organic light emitting diode, and the second driving voltage may be a low potential voltage for driving the organic light emitting diode. For example, the first driving voltage may have a higher potential than the second driving voltage.

The circuit board FPCB may be attached onto the second pads using an anisotropic conductive film. Accordingly, the lead lines of the circuit board FPCB may be electrically connected to the second pads. The circuit board FPCB may be a flexible film, such as a flexible printed circuit board, a printed circuit board, or a chip on film.

As illustrated in FIGS. 1 and 2, the display device 1 may be divided into a first area A1 to a third area A3 based on the operation state. In a plan view the first area A1 may be positioned at the upper side in the first direction DR1 of the display device 1, the second area A2 connected to the first area A1 may be positioned below the first area A1, and the third area A3 connected to the second area A2 may be positioned below the second area A2. The first area A1 to the third area A3 may be sequentially arranged. The second area A2 may be disposed between the first area A1 and the third area A3.

The first area A1 to the third area A3 may be distinguished by folding lines FL1 and FL2. For example, the first area A1 and the second area A2 may be distinguished by a first folding line FL1 extending along the second direction DR2, and the second area A2 and the third area A3 may be distinguished by a second folding line FL2 extending along the second direction DR2. The display device 1 may be folded twice, once with respect to the folding line FL1 and again with respect to the folding line FL2.

As illustrated in FIG. 2, the folding operation of the display device 1 may be performed based on the second area A2 in such a way that the first area A1 is folded, for example, in a downward direction along the first folding line FL1 such that the first area A1 is folded behind the second area A2, and the third area A3 is folded in an upward direction along the second folding line FL2 such that the third area A3 is folded in front of the second area A2. In this case, when viewed from above, the third area A3 of the display device 1 may be positioned at the top.

However, the folding operation illustrated above is not necessarily limited thereto.

Figure 5:
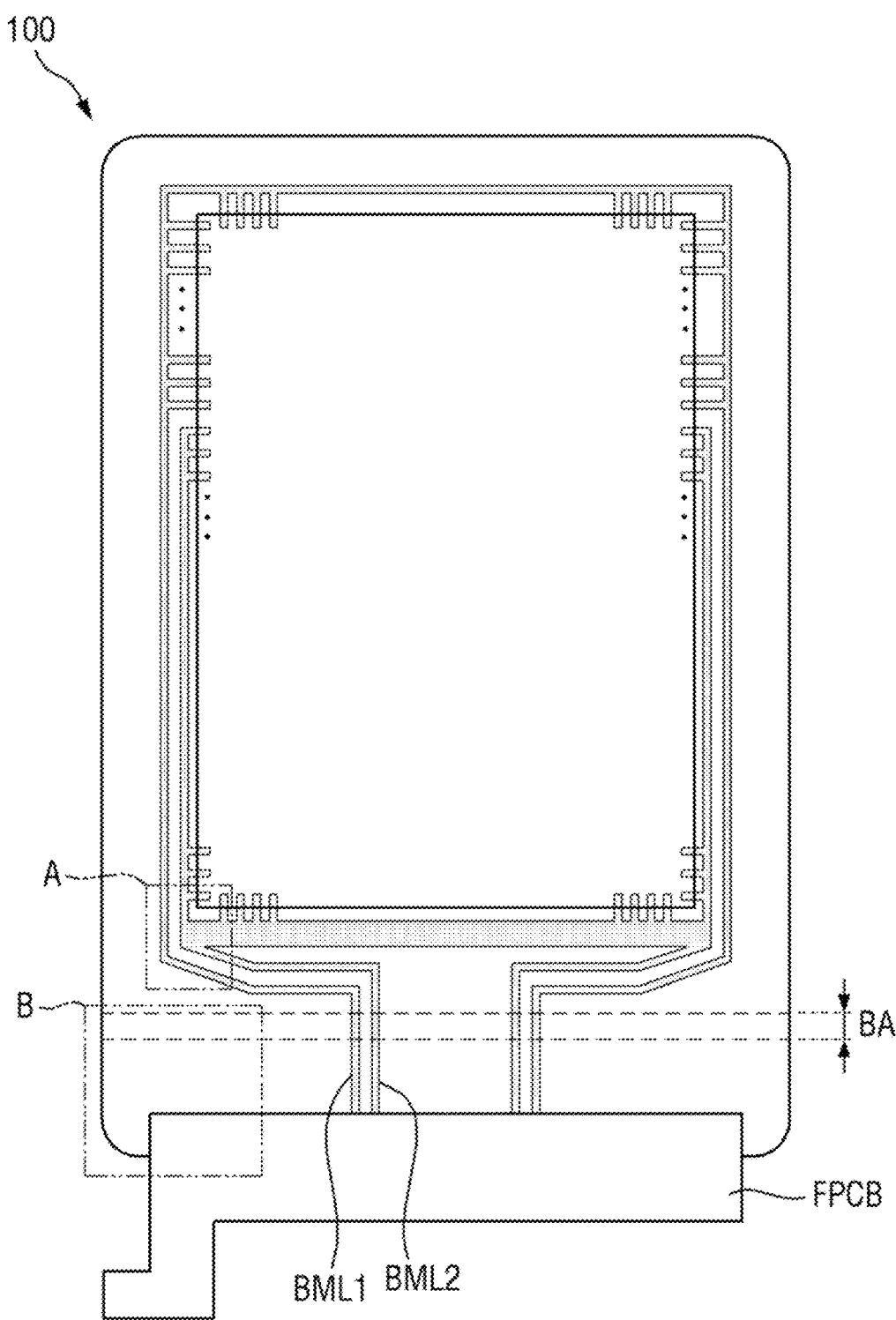
FIG. 5 is a plan view of a display panel including a lower metal line according to an exemplary embodiment of the present disclosure.

FIG. 5 is a plan view of a display panel including a lower metal line according to an exemplary embodiment of the present disclosure.

Referring to FIG. 5 the display panel 100 according to an exemplary embodiment of the present disclosure may further include lower metal lines BML. The lower metal lines BML may each surround at least a portion of the display area DA. In FIG. 5, for simplicity of description, only the lower metal lines BML1 and BML2 positioned outside the display area DA, i.e., in the non-display area. NDA, are illustrated.

The display area DA may have a rectangular shape in a plan view. For example, the display area DA may include a pair of long sides extending along the first direction DR1 and a pair of short sides extending along the second direction DR2.

The lower metal lines BML may include first lower metal lines BML1 and second lower metal lines BML2.

The second lower metal lines BML2 may be positioned between the display area DA and the first lower metal lines BML1 in a plan view.

The lower metal lines BML may be electrically connected to the circuit board FPCB. The lower metal lines BML may each be electrically connected to the circuit board FPCB through the second pads. The lower metal lines BML may be applied with a constant voltage through the second pads.

For example, the first lower metal lines BML1 may be disposed based on a bisector extending in the second direction DR2 in the display panel 100, may be connected respectively to the second pads disposed in the second pad area, and may have a laterally symmetrical shape.

The first lower metal lines BML1 connected respectively to the second pads may extend upward in the first direction DR1, be bent in the second direction DR2 (to cover a portion of the lower short side of the display area DA), and then extend again in the first direction DR1 (to cover the left and right long sides of the display area DA). Subsequently, the first lower metal lines BML1 may be bent in the second direction DR2 (to cover the upper short side of the display area DA).

The second lower metal lines BML2 may be disposed between the first lower metal lines BML1 and the display area DA.

The second lower metal lines BML2 may be disposed based on a bisector extending in the second direction DR2 of the display panel 100, may be connected respectively to the second pads disposed in the second pad area, and may have a laterally symmetrical shape.

The second lower metal lines BML2 connected respectively to the second pads may extend upward in the first direction DR1, and be bent toward the second direction DR2 (to cover a portion of the lower short side of the display area DA), and then extend again in the first direction DR1 (to cover portions of the left and right long sides of the display area DA).

FIG. 6 is a circuit diagram specifically illustrating a sub-pixel according to an exemplary embodiment of the present disclosure.

Referring to FIG. 6, the sub-pixel SP may be connected to a $(k-1)^{th}$ (where k is an integer of 2 or more) scan line Sk-1, a $k^{th}$ scan line Sk, and a $j^{th}$ (j is a positive integer) data line Dj. In addition, the sub-pixel SP may be connected to the first driving voltage line VDDL to which the first driving voltage is supplied, an initialization voltage line VIL to which an initialization voltage Vini is supplied, and a second driving voltage line VSSL to which a second driving voltage is supplied.

The sub-pixel SP includes a driving transistor DT, a light emitting element LEL, switch elements, and a capacitor C1. The switch elements include first to sixth transistors ST1, ST2, ST3, ST4, ST5, and ST6.

The driving transistor DT may include a gate electrode, a first electrode, and a second electrode. The driving transistor DT controls a drain-source current Ids (hereinafter, referred to as "driving current") flowing between the first electrode and the second electrode according to a data voltage applied to the gate electrode. The driving current Ids flowing through a channel of the driving transistor DT is proportional to the square of the difference between a threshold voltage and a voltage Vgs between the gate electrode and the source electrode of the driving transistor DT, as shown in Eq. 1.

$$Ids = k' \times (Vgs - Vth)^2 \qquad \text{Eq. 1}$$

In Eq. 1, k' is a proportional coefficient determined by the structure and physical characteristics of the driving transistor, Vgs is a gate-source voltage of the driving transistor, and Vth is a threshold voltage of the driving transistor.

The light emitting element LEL emits light by the driving current Ids. A light emission amount of the light emitting element LEL may be proportional to the driving current Ids.

The light emitting element LEL may be an organic light emitting diode (OLED) including an anode electrode, a cathode electrode, and an organic light emitting layer disposed between the anode electrode and the cathode electrode. Alternatively, the light emitting element LEL may be an inorganic light emitting element including an anode electrode, a cathode electrode, and an inorganic semiconductor disposed between the anode electrode and the cathode electrode. Alternatively, the light emitting element LEL way be a quantum dot light emitting element including an anode electrode, a cathode electrode, and a quantum dot light emitting layer disposed between the anode electrode and the cathode electrode. Alternatively, the light emitting element LEL may be a micro light emitting diode.

The anode electrode of the light emitting element LEL may be connected to a first electrode of the fourth transistor ST4 and a second electrode of the sixth transistor ST6, and the cathode electrode of the light emitting element LEL may be connected to the second driving voltage line VSSL. A parasitic capacitance Ce1 may be formed between the anode electrode and the cathode electrode of the light emitting element LEL.

The first transistor ST1 may be formed as a dual transistor including a first-first transistor ST1-1 and a first-second transistor ST1-2. The first-first transistor ST1-1 and the first-second transistor ST1-2 are turned on by the scan signal of the $k^{th}$ scan line Sk to connect the gate electrode and the second electrode of the driving transistor DT. For example, when the first-first transistor ST1-1 and the first-second transistor ST1-2 are turned on, since the gate electrode and the second electrode of the driving transistor DT are connected, the driving transistor DT acts as a diode. The gate electrode of the first-first transistor ST1-1 may be connected to the $k^{th}$ scan line Sk, and the first electrode thereof may be connected to the second electrode of the first-second transistor ST1-2, and the second electrode thereof may be connected to the gate electrode of the driving transistor DT. The gate electrode of the first-second transistor ST1-2 may be connected to the $k^{th}$ scan line Sk, the first electrode thereof may be connected to the second electrode of the driving transistor DT, and the second electrode thereof may be connected to the first electrode of the first-first transistor ST1-1.

The second transistor ST2 may be turned on by the scan signal of the $k^{th}$ scan line Sk to connect the first electrode of the driving transistor DT to the $j^{th}$ data line Dj. The gate electrode of the second transistor ST2 may be connected to the $k^{th}$ scan line Sk, the first electrode thereof may be connected to the first electrode of the driving transistor DT, and the second electrode thereof may be connected to the $j^{th}$ data line Dj.

The third transistor ST3 may be formed as a dual transistor including a third-first transistor ST3-1 and a third-second transistor ST3-2. The third-first transistor ST3-1 and the third-second transistor ST3-2 are turned on by the scan signal of the $(k-1)^{th}$ scan line Sk-1 to connect the gate electrode of the driving transistor DT to the initialization voltage line VIL. The gate electrode of the driving transistor DT may be discharged to the initialization voltage of the initialization voltage line VIL. The gate electrode of the third-first transistor ST3-1 may be connected to the $(k-1)^{th}$ scan line Sk-1, the first electrode thereof may be connected to the gate electrode of the driving transistor DT, and the second electrode thereof may be connected to the first electrode of the third-second transistor ST3-2. The gate electrode of the third-second transistor ST3-2 may be connected to the $(k-1)^{th}$ scan line Sk-1, and the first electrode thereof may be connected to the second electrode of the third-first transistor ST3-1, and the second electrode thereof may be connected to the initialization voltage line VIL.

The fourth transistor ST4 is turned on by the scan signal of the $k^{th}$ scan line Sk to connect the anode electrode of the light emitting element LEL to the initialization voltage line VIL. The anode electrode of the light emitting element LEL may be discharged to an initialization voltage. The gate electrode of the fourth transistor ST4 is connected to the $k^{th}$ scan line Sk, the first electrode thereof is connected to the anode electrode of the light emitting element LEL, and the second electrode thereof is connected to the initialization voltage Line VIL.

The fifth transistor ST5 is turned on by the emission control signal of a $k^{th}$ light emitting line Ek to connect the first electrode of the driving transistor DT to the first driving voltage line VDDL. The gate electrode of the fifth transistor ST5 is connected to the $k^{th}$ light emitting line Ek, the first electrode thereof is connected to the first driving voltage line VDDL, and the second electrode thereof is connected to the source electrode of the driving transistor DT.

The sixth transistor ST6 is connected between the second electrode of the driving transistor DT and the anode electrode of the light emitting element LEL. The sixth transistor ST6 is turned on by the emission control signal of the $k^{th}$ light emitting line Ek to connect the second electrode of the driving transistor DT to the anode electrode of the light emitting element LEL. The gate electrode of the sixth transistor ST6 is connected to the $k^{th}$ light emitting line Ek, the first electrode thereof is connected to the second electrode of the driving transistor DT, and the second electrode thereof is connected to the anode electrode of the light emitting element LEL. When the fifth transistor ST5 and the sixth transistor ST6 are both turned on, the driving current Ids may be supplied to the light emitting element LEL.

The capacitor C1 is formed between the second electrode of the driving transistor DT and the first driving voltage line VDDL. One electrode of the capacitor C1 may be connected to the second electrode of the driving transistor DT, and the other electrode thereof may be connected to the first driving voltage line VDDL.

When the first electrode of each of the driving transistor DT and the first to sixth transistors ST1 to ST6 is a source electrode, the second electrode thereof may be a drain electrode. Alternatively, when the first electrode of each of the driving transistor DT and the first to sixth transistors ST1 to ST6 is a drain electrode, the second electrode thereof may be a source electrode.

An active layer of each of the driving transistor DT and the first to sixth transistors ST1 to ST6 may include polysilicon, amorphous silicon, and/or an oxide semiconductor. When a semiconductor layer of each of the driving transistor DT and the first to sixth transistors ST1 to ST6 is formed of polysilicon, a process for forming the semiconductor layer may be a low temperature polysilicon (LTPS) process.

In addition, the driving transistor DT and the first to sixth transistors ST1 to ST6 have been described as being formed of a p-type metal oxide semiconductor field effect transistor (MOSFET), but without being limited thereto, they may be formed of an n-type MOSFET.

The first driving voltage of the first driving voltage line VDDL, the second driving voltage of the second driving voltage line VSSL, and the initialization voltage of the initialization voltage line VIL may be set in consideration of the characteristics of the driving transistor DT and the characteristics of the light emitting element LEL. For example, the voltage difference between the initialization voltage and the data voltage supplied to the source electrode of the driving transistor DT may be set to be smaller than the threshold voltage of the driving transistor DT.

A lower metal line T-BML (which is the same as BML of FIG. 5) may overlap the driving transistor DT. The lower metal line T-BML may overlap the channel (or active) of the driving transistor DT, and may be spaced apart from the channels (or actives) of the first to sixth transistors ST1 to ST6 without overlapping them.

Figure 7:
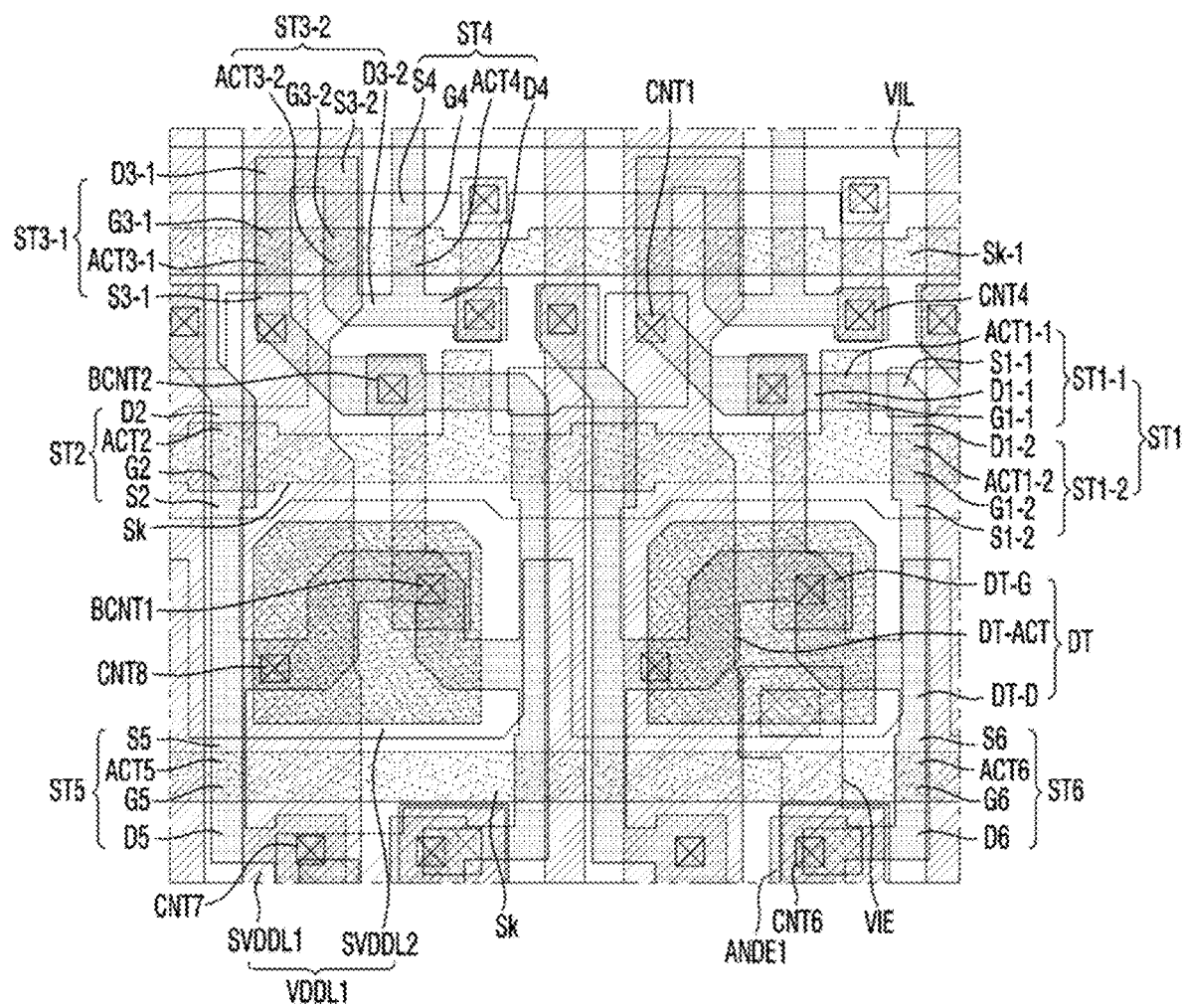
FIG. 7 is a plan view specifically illustrating a sub-pixel according to an exemplary embodiment of the present disclosure.

FIG. 7 is a plan view specifically illustrating a sub-pixel according to an exemplary embodiment of the present disclosure.

Referring to FIG. 7, the sub-pixel SP may include the driving transistor DT, the first to sixth transistors ST1 to ST6, the capacitor C1, a first connection electrode BE1, and a second connection electrode VIE, and a data connection electrode DCE.

The sub-pixel SP may overlap the $(k-1)^{th}$ scan line Sk-1, the $k^{th}$ scan line Sk, the $k^{th}$ light emitting line Ek, the $j^{th}$ data line Dj, a first driving voltage line VDDL1, and the initialization voltage line VIL, in the third direction DR3. The sub-pixel SP may be connected to the $(k-1)^{th}$ scan line Sk-1, the $k^{th}$ scan line Sk, the $j^{th}$ data line Dj, and the first driving voltage line VDDL1, through the first to sixth transistors ST1 to ST6. The $(k-1)^{th}$ scan line Sk-1, the $k^{th}$ scan line Sk, the $k^{th}$ light emitting line Ek, and the initialization voltage line VIL may extend in the second direction DR2. The $j^{th}$ data line Dj may extend in the first direction DR1.

The first driving voltage line VDDL1 may include a first sub-driving voltage line SVDDL1 and a second sub-driving voltage line SVDDL2. The first sub-driving voltage line SVDDL1 may extend in the first direction DR1, and the second sub-driving voltage line SVDDL2 may extend in the second direction DR2. The first sub-driving voltage line SVDDL1 may be disposed between the $j^{th}$ data line Dj and the first connection electrode BE1, in the second direction DR2. The second sub-driving voltage line SVDDL2 may be disposed between the $k^{th}$ scan line Sk and the $k^{th}$ light emitting line Ek, in the first direction DR1. The first sub-driving voltage line SVDDL1 may be connected to the second sub-driving voltage line SVDDL2 through the eighth contact hole CNT8.

The driving transistor DT may include an active layer DT-ACT, a gate electrode DT-G, a first electrode, and a second electrode DT-D. The active layer DT-ACT of the driving transistor DT may overlap the gate electrode DT-G of the driving transistor DT in the third direction DR3. The gate electrode DT-G may be disposed on the active layer DT-ACT of the driving transistor DT.

The gate electrode DT-G may be connected to the first connection electrode BE1 through a first connection contact hole BCNT1. The first connection electrode BE1 may be connected to the second electrode D1-1 of the first-first transistor ST1-1 through the second connection contact hole BCNT2. Since the first connection electrode BE1 extends in the first direction DR1, it may cross the $k^{th}$ scan line Sk.

The first electrode of the driving transistor DT may be connected to a first electrode S2 of the second transistor ST2. The second electrode DT-D of the driving transistor DT may be connected to a first electrode S1-2 of the first-second transistor ST1-2 and a first electrode S6 of the sixth transistor ST6.

The first transistor ST1 may be formed as a dual transistor. The first transistor ST1 may include the first-first transistor ST1-1 and the first-second transistor ST1-2.

The first-first transistor ST1-1 may include an active layer ACT1-1, a gate electrode G1-1, a first electrode S1-1, and the second electrode D1-1. The gate electrode G1-1 of the first-first transistor ST1-1 is a part of the $k^{th}$ scan line Sk, and may be a region where the active layer ACT1-1 of the first-first transistor ST1-1 overlaps the $k^{th}$ scan line Sk in the third direction DR3. The first electrode S1-1 of the first-first transistor ST1-1 may be connected to a second electrode D1-2 of the first-second transistor ST1-2. The second electrode D1-1 of the first-first transistor ST1-1 may be connected to the first connection electrode BE1 through the second connection contact hole BCNT2.

The first-second transistor ST1-2 may include an active layer ACT1-2, a gate electrode G1-2, the first electrode S1-2, and the second electrode D1-2. The gate electrode G1-2 of the first-second transistor ST1-2 is a part of the $k^{th}$ scan line Sk and may be a region where the active layer ACT1-2 of the first-second transistor ST1-2 overlaps the $k^{th}$ scan line Sk in the third direction DR3. The first electrode S1-2 of the first-second transistor ST1-2 may be connected to the second electrode DT-D of the driving transistor DT. The second electrode D1-2 of the first-second transistor ST1-2 may be connected to the first electrode S1-1 of the first-first transistor ST1-1.

The second transistor ST2 may include an active layer ACT2, a gate electrode G2, the first electrode S2, and a second electrode D2. The gate electrode G2 of the second transistor ST2 is a part of the $k^{th}$ scan line Sk, and may be a region where the active layer ACT2 of the second transistor ST2 overlaps the $k^{th}$ scan line Sk in the third direction DR3. The first electrode S2 of the second transistor ST2 may be connected to the first electrode of the driving transistor DT. The second electrode D2 of the second transistor ST2 may be connected to the data connection electrode DCE through a third contact hole CNT3. The data connection electrode DCE may be connected to the $j^{th}$ data line Dj through a data contact hole DCNT.

The third transistor ST3 may be formed as a dual transistor. The third transistor ST3 may include the third-first transistor ST3-1 and the third-second transistor ST3-2.

The third-first transistor ST3-1 may include an active layer ACT3-1, a gate electrode G3-1, a first electrode S3-1, and a second electrode D3-1. The gate electrode G3-1 of the third-first transistor ST3-1 is a part of the $(k-1)^{th}$ scan line Sk-1, and may be a region where the active layer ACT3-1 of the third-first transistor ST3-1 overlaps the $(k-1)^{th}$ scan line Sk-1. The first electrode S3-1 of the third-first transistor ST3-1 may be connected to the first connection electrode BE1 of the driving transistor DT through the second connection contact hole BCNT2. The second electrode D3-1 of the third-first transistor ST3-1 may be connected to a first electrode S3-2 of the third-second transistor ST3-2.

The third-second transistor ST3-2 may include an active layer ACT3-2, a gate electrode G3-2, the first electrode S3-2, and a second electrode D3-2. The gate electrode G3-2 of the third-second transistor ST3-2 is a part of the $(k-1)^{th}$ scan line Sk-1, and may be a region where the active layer ACT3-2 of the third-second transistor ST3-2 overlaps the $(k-1)^{th}$ scan line Sk-1. The first electrode S3-2 of the third-second transistor ST3-2 may be connected to the second electrode D3-1 of the third-first transistor ST3-1. The second electrode D3-2 of the third-second transistor ST3-2 may be connected to the second connection electrode VIE through a fourth contact hole CNT4.

The fourth transistor ST4 may include an active layer ACT4, a gate electrode G4, a first electrode S4, and a second electrode D4. The gate electrode G4 of the fourth transistor ST4 is a part of the $k^{th}$ scan line Sk, and may be a region where the active layer ACT4 of the fourth transistor ST4 overlaps the $k^{th}$ scan line Sk. The first electrode S4 of the fourth transistor ST4 may be connected to a first anode connection electrode ANDE1 through a sixth contact hole CNT6. The anode electrode of the light emitting element may be connected to the first anode connection electrode ANDE1 through a second anode connection electrode. The second electrode D4 of the fourth transistor ST4 may be connected to the second connection electrode VIE through the fourth contact hole CNT4. The initialization voltage line VIL may be connected to the second connection electrode VIE through a fifth contact hole CNT5, and the second connection electrode VIE may be connected to the second electrode D3-2 of the third-second transistor ST3-2 and the second electrode D4 of the fourth transistor ST4 through the fourth contact hole CNT4. The second connection electrode VIE extends in the first direction DR1 and may intersect the $(k-1)^{th}$ scan line Sk-1.

The fifth transistor ST5 may include an active layer ACT5, a gate electrode G5, a first electrode S5, and a second electrode D5. The gate electrode G5 of the fifth transistor ST5 is a part of a $k^{th}$ emission control line ELk, and may be a region where the active layer ACT5 of the fifth transistor ST5 overlaps the $k^{th}$ emission control line ELk. The first electrode S5 of the fifth transistor ST5 may be connected to the first sub-driving voltage line SVDDL1 through a seventh contact hole CNT7. The second electrode D5 of the fifth transistor ST5 may be connected to the first electrode of the driving transistor DT.

The sixth transistor ST6 may include an active layer ACT6, a gate electrode G6, a first electrode S6, and a second electrode D6. The gate electrode G6 of the sixth transistor ST6 is a part of the $k^{th}$ emission control line ELk, and may be a region where the active layer ACT6 of the sixth transistor ST6 overlaps the $k^{th}$ emission control line ELk. The first electrode S6 of the sixth transistor ST6 may be connected to the second electrode DT-D of the driving transistor DT. The second electrode D6 of the sixth transistor ST6 may be connected to an anode electrode AND of the light emitting element through the sixth contact hole CNT6.

A first electrode CE11 of the capacitor C1 is a part of the second electrode DT-D of the driving transistor DT, and a second electrode CE12 of the capacitor C1 may be the second sub-driving voltage line SVDDL2 that overlaps the second electrode DT-D of the driving transistor DT.

The lower metal line T-BML may overlap the driving transistor DT. The lower metal line T-BML may overlap the channel of the driving transistor DT, and may be spaced apart from the channels of the first to sixth transistors ST1 to ST6 without overlapping them.

Figure 8:
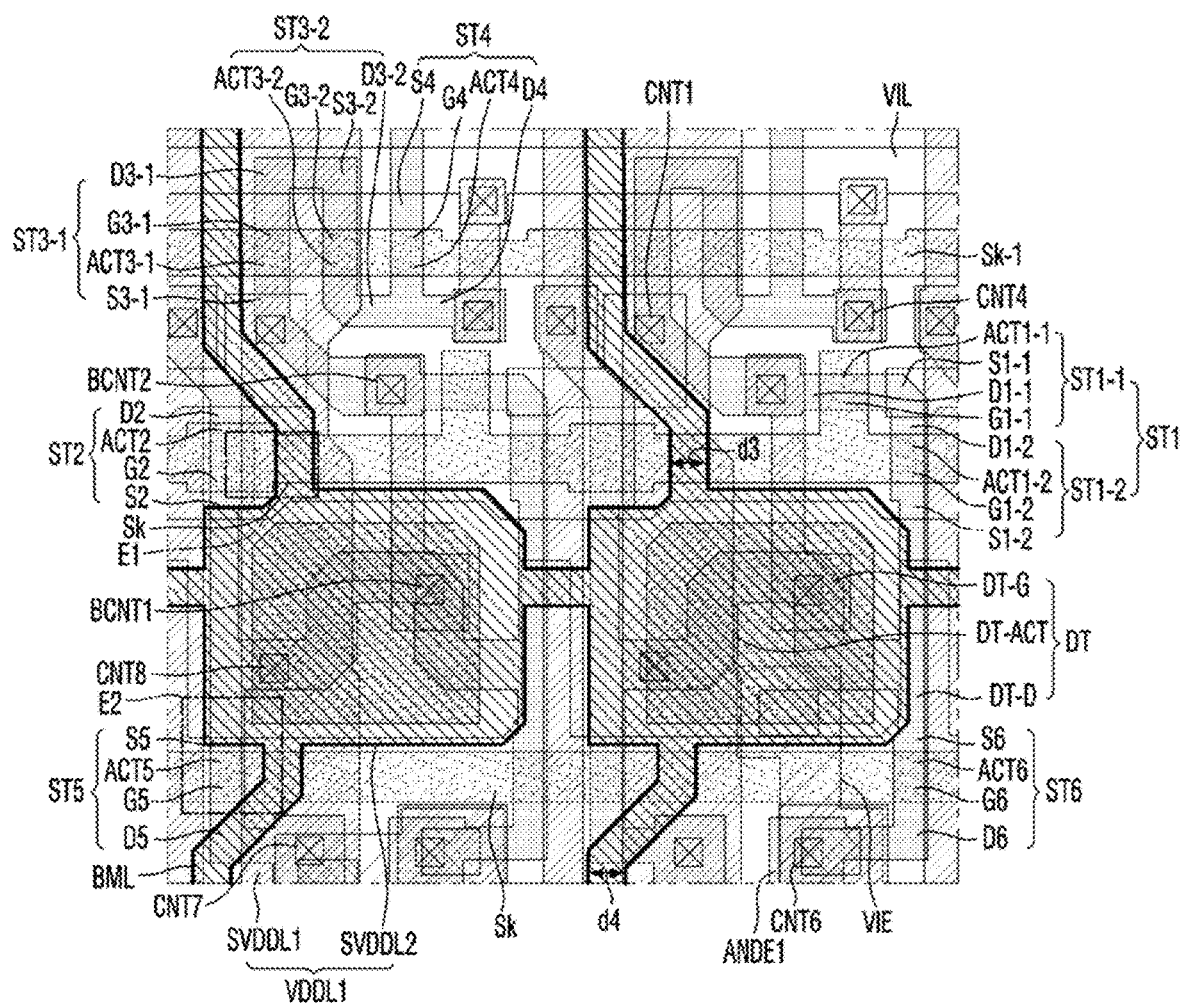
FIG. 8 is a plan view specifically illustrating a sub-pixel in which a lower metal line is disposed according to an exemplary embodiment of the present disclosure.

FIG. 8 is a plan view specifically illustrating a sub-pixel in which a lower metal line is disposed according to an exemplary embodiment of the present disclosure.

Referring to FIG. 8, the lower metal line BML may overlap the channel of the driving transistor DT in the thickness direction, and might not overlap the channels of the first to sixth transistors ST1 to ST6.

For example, the lower metal line BML may overlap the gate electrode DT-G of the driving transistor DT in the thickness direction. The lower metal line BML may be larger than the gate electrode DT-G in a plan view. The lower metal line BML may completely cover the gate electrode DT-G. The lower metal line BML may further extend upward, and may cross the $k^{th}$ scan line Sk, the $(k-1)^{th}$ scan line Sk-1, and the initialization voltage line VIL. The lower metal line BML may further extend downward, and may cross the $k^{th}$ scan line Sk.

Figure 9:
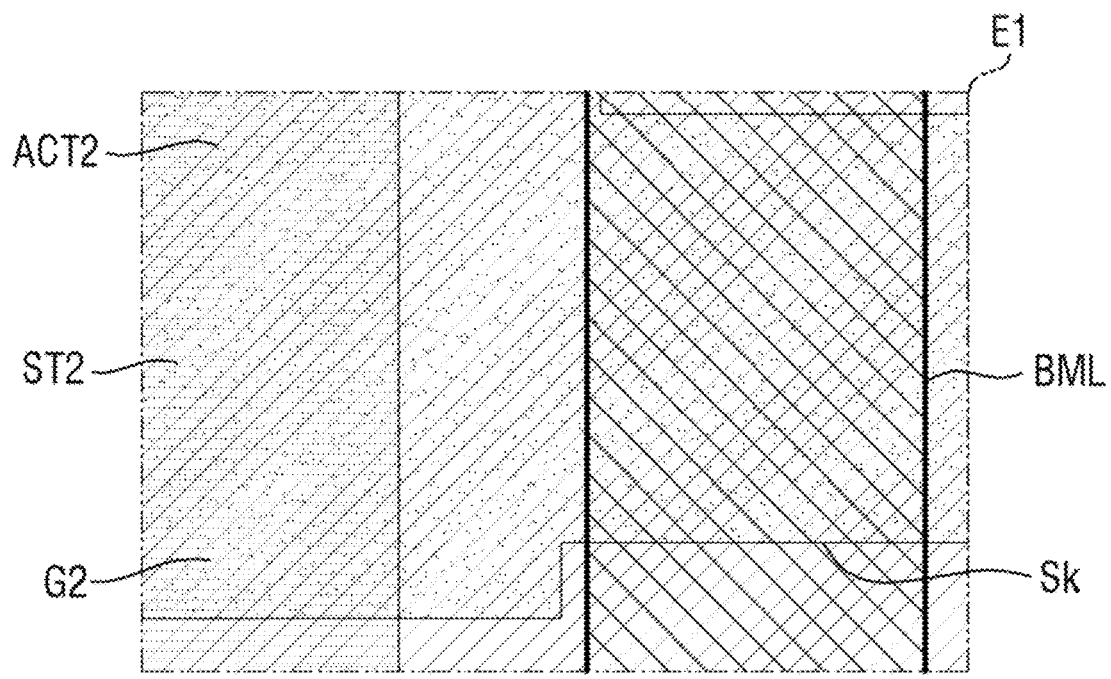
FIG. 9 is an enlarged view of area E1 of FIG. 8.

FIG. 9 is an enlarged view of area E1 of FIG. 8. This figure is offered to more clearly illustrate an exemplary structures of the second transistor ST2 including the active layer ACT2 and the gate electrode G2 and the structural relationship it has with the lower metal line BML and the scan line Sk.

Figure 13:
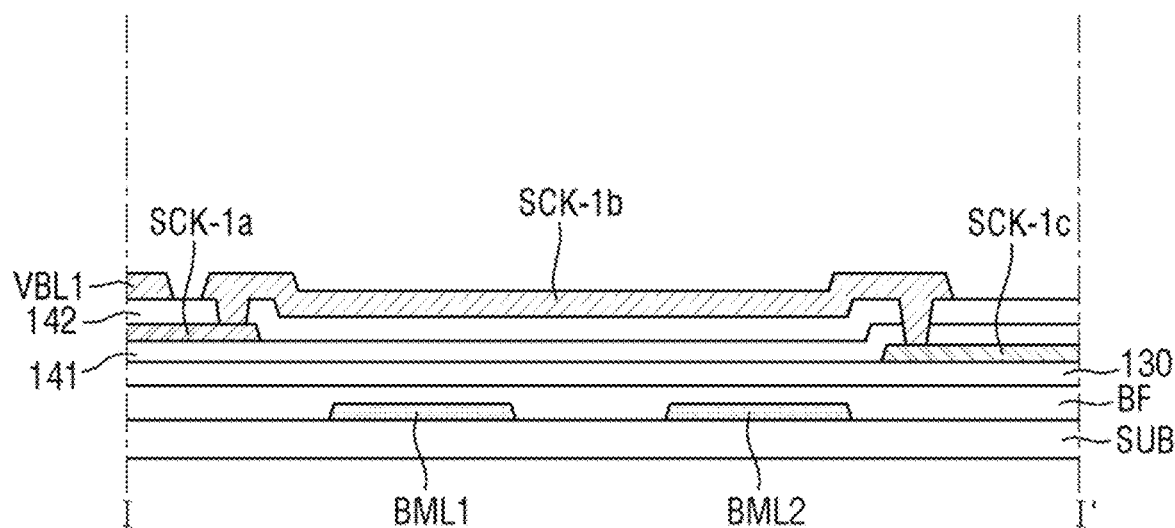
FIG. 13 is a cross-sectional view taken along line I-1' of FIG. 12.
Figure 14:
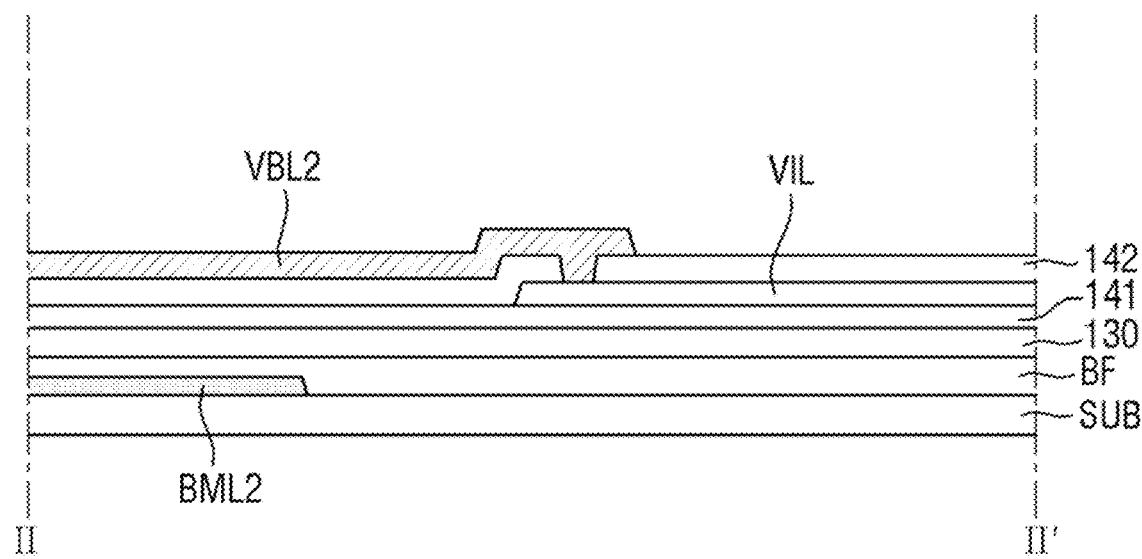
FIG. 14 is a cross-sectional view taken along line of FIG. 12.

First, the laminated structure of the display panel 100 will be described with reference to FIGS. 13 to 15 together.

A thin film transistor layer, a light emitting element layer, and an encapsulation layer may be sequentially disposed on a substrate SUB.

The thin film transistor layer includes the lower metal line BML, a buffer film BF, an active layer, a first gate layer, a second gate layer, a first data metal layer, a second data metal layer, a gate insulating film 130, a first interlayer insulating film 141, a second interlayer insulating film 142, a protective film 150, a first organic film 160, and a second organic film.

The lower metal line BML may be disposed on one surface of the substrate SUB. The lower metal line BML may overlap the active layer DT-ACT of the driving transistor DT in the third direction DR3 to block light incident on the active layer DT-ACT of the driving transistor DT. The third direction DR3 may be the thickness direction of the substrate SUB. The lower metal line BML may be formed as a single layer or multiple layers including molybdenum (Mo), aluminum (Al), chromium (Cr), gold (Au), titanium (Ti), nickel (Ni), neodymium (Nd), and/or copper (Cu) or an alloy thereof.

The buffer film BF may be disposed on the lower metal line BML. The buffer film BF may be disposed on the substrate SUB to protect the thin film transistors and the organic light emitting layer of the light emitting element layer from moisture permeating through the substrate SUB susceptible to moisture permeation. The buffer film BF may be formed of a plurality of inorganic layers that are alternately stacked. For example, the buffer film BF may be formed of multiple layers in which one or more inorganic layers of a silicon nitride layer, a silicon oxynitride layer, a silicon oxide layer, a titanium oxide layer and an aluminum oxide layer are alternately stacked. The buffer film BF may be omitted.

The active layer may be disposed on the substrate SUB or the buffer film BF. The active layer may include polycrystalline silicon, monocrystalline silicon, low-temperature polycrystalline silicon, amorphous silicon, or an oxide semiconductor. When the active layer is made of polycrystalline silicon or an oxide semiconductor, the ion-doped active layer may have conductivity. Accordingly, the active layer may include not only the active layers DT-ACT, ACT1 to ACT6 of the driving transistor DT and the first to sixth switching transistors ST1 to ST6, but also the source electrodes S1, S2-1, S2-2, S3-1, S3-2, S4, S5, and S6 and the drain electrodes DT-D, D1, D2-1, D2-2, D3-1, D3-2, D4, D5, and D6 of the driving transistor DT and the first to sixth switching transistors ST1 to ST6.

The gate insulating film 130 may be disposed on the active layer. The gate insulating film 130 may be formed of an inorganic layer, for example, a silicon nitride layer, a silicon oxynitride layer, a silicon oxide layer, a titanium oxide layer, or an aluminum oxide layer.

The first gate layer may be disposed on the gate insulating film 130. The first gate layer may include not only the gate electrode of the driving transistor DT and the gate electrodes G1 to G6 of the first to sixth switching transistors ST1 to ST6, but also the scan lines Sk-1 and Sk, and the light emitting line Ek. The first gate layer may be formed as a single layer or multiple layers that include molybdenum (Mo), aluminum (Al), chromium (Cr), gold (Au), titanium (Ti), nickel (Ni), neodymium (Nd), and/or copper (Cu) or an alloy thereof.

The first interlayer insulating film 141 may be disposed on the first gate layer. The first interlayer insulating film 141 may be formed of an inorganic layer, for example, a silicon nitride layer, a silicon oxynitride layer, a silicon oxide layer, a titanium oxide layer, or an aluminum oxide layer. The first interlayer insulating film 141 may include a plurality of inorganic layers.

The second gate layer may be disposed on the first interlayer insulating film 141. The second gate layer may include the initialization voltage line VIL, the second sob-driving voltage line SVDDL2, and a shielding electrode SHE. The second gate layer may be formed as a single layer or multiple layers including molybdenum (Mo), aluminum (Al), chromium (Cr), gold (Au), titanium (Ti), nickel (Ni), neodymium (Nd), and/or copper (Cu) or an alloy thereof.

The second interlayer insulating film 142 may be disposed on the second gate layer. The second interlayer insulating film 142 may be formed of an inorganic layer, for example, a silicon nitride layer, a silicon oxynitride layer, a silicon oxide layer, a titanium oxide layer, or an aluminum oxide layer. The second interlayer insulating film 142 may include a plurality of inorganic layers.

The first data metal layer may be disposed on the second interlayer insulating film 142. The first data metal layer may include the first sub-driving voltage line SVDDL1, the first connection electrode BE1, the second connection electrode VIE, and the first anode connection electrode ANDE1. The first data metal layer may be formed as a single layer or multiple layers including molybdenum (Mo), aluminum (Al), chromium (Cr), gold (Au), titanium (Ti), nickel (Ni), neodymium (Nd), and/or copper (Cu) or an alloy thereof.

The first organic film 160 for flattening stepped portions generated by the active layer, the first gate layer, the second gate layer, and the first data metal layer may be disposed on the first data metal layer. The first organic film 160 may be formed of an organic layer such as acryl resin, epoxy resin, phenolic resin, polyamide resin, polyimide resin and the like.

The protective film 150 may be additionally formed between the first data metal layer and the first organic film 160. The protective film 150 may be formed of an inorganic layer, for example, a silicon nitride layer, a silicon oxynitride layer, a silicon oxide layer, a titanium oxide layer, or an aluminum oxide layer.

The second data metal layer may be disposed on the first organic film 160. The second data metal layer may include data lines Dj and Dj+1 and the second anode connection electrode. The second data metal layer may be formed as a single layer or multiple layers including molybdenum (Mo), aluminum (Al), chromium (Cr), gold (Au), titanium (Ti), nickel (Ni), neodymium (Nd), and/or copper (Cu) or an alloy thereof.

The second organic film for flattening stepped portions may be disposed on the second data metal layer. The second organic film may be formed of an organic layer such as acryl resin, epoxy resin, phenolic resin, polyamide resin, polyimide resin and the like.

The first connection contact hole BCNT1 may penetrate the first interlayer insulating film 141 and the second interlayer insulating film 142 to expose the gate electrode DT-G of the driving transistor DT. The first connection electrode BE1 may be connected to the gate electrode DT-G of the driving transistor DT through the first connection contact hole BCNT1.

The second connection contact hole BCNT2 may penetrate the gate insulating film 130, the first interlayer insulating film 141, and the second interlayer insulating film 142 to expose the second electrode D1-1 of the first-first transistor ST1-1. The first connection electrode BE1 may be connected to the second electrode D1-1 of the first-first transistor ST1-1 through the second connection contact hole BCNT2.

The data contact hole DCNT may penetrate the first organic film 160 to expose the data connection electrode DCE. Each of the data lines Dj and Dj+1 may be connected to the data connection electrode DCE through the data contact hole DCNT.

The first contact hole CNT1 may penetrate the second interlayer insulating film 142 to expose the shielding electrode SHE. The first sub-driving voltage line SVDDL1 may be connected to the shielding electrode SHE through the first contact hole CNT1.

The third contact hole CNT3 may penetrate the gate insulating film 130, the first interlayer insulating film 141, and the second interlayer insulating film 142 to expose the first electrode S2 of the second transistor ST2. The data connection electrode DCE may be connected to the first electrode S2 of the second transistor ST2 through the third contact bole CNT3.

The fourth contact hole CNT4 may penetrate the gate insulating film 130, the first interlayer insulating film 141, and the second interlayer insulating film 142 to expose the second electrode D1 of the first transistor ST1 and the second electrode D4 of the fourth transistor ST4. The second connection electrode VIE may be connected to the second electrode D1-2 of the first-second transistor ST1-2 and the second electrode D4 of the fourth transistor ST4 through the fourth contact hole CNT4.

The fifth contact hole CNT5 may penetrate the second interlayer insulating film 142 to expose the initialization voltage line VIL. The second connection electrode VIE may be connected to the initialization voltage line VIL through the fifth contact bole CNT5.

The sixth contact hole CNT6 may penetrate the gate insulating film 130, the first interlayer insulating film 141, and the second interlayer insulating film 142 to expose the second electrode D6 of the sixth transistor ST6. The anode connection electrode ANDE may be connected to the second electrode D6 of the sixth transistor ST6 through the sixth contact hole CNT6.

The seventh contact hole CNT7 may penetrate the gate insulating film 130, the first interlayer insulating film 141, and the second interlayer insulating film 142 to expose the first electrode S5 of the fifth transistor ST5. The first sub-driving voltage line SVDDL1 may be connected to the first electrode S5 of the fifth transistor ST5 through the seventh contact hole CNT7.

The eighth contact hole CNT5 may penetrate the second interlayer insulating film 142 to expose the second sub-driving voltage line SVDDL2. The first sub-driving voltage line SVDDL1 may be connected to the second sub-driving voltage line SVDDL2 through the eighth contact hole CNT8.

A first anode contact hole may penetrate the protective film 150 and the first organic film 160 to expose the first anode connection electrode ANDE1. The second anode connection electrode may be connected to the first anode connection electrode ANDE1 through the first anode contact hole.

A second anode contact hole may penetrate the second organic film to expose the second anode connection electrode.

The light emitting element layer is disposed on the thin film transistor layer. The light emitting element layer includes light emitting elements and a pixel defining layer.

The light emitting elements and the pixel defining layer are disposed on the first organic film 160. Each of the light emitting elements may include a first electrode, an organic light emitting layer, and a second electrode.

The first electrode may be disposed on the first organic film 160. The first electrode may be connected to the second anode connection electrode through the second anode contact hole.

In a top emission structure in which light is emitted toward the second electrode when viewed with respect to the organic light emitting layer, the first electrode may be formed of a metal material having high reflectivity to have a stacked structure (Ti/Al/Ti) of aluminum and titanium, a stacked structure (ITO/Al/ITO) of aluminum and ITO, an APC alloy, and a stacked structure (ITO/APC/ITO) of an APC alloy and ITO. The APC alloy is an alloy of silver (Ag), palladium (Pd), and copper (Cu).

The pixel defining layer may partition the first electrode on a planarization film to serve to define the emission region of each of the sub-pixels SP. The pixel defining layer may cover an edge of the first electrode. The pixel defining layer may be formed of an organic layer such as acryl resin, epoxy resin, phenolic resin, polyamide resin, polyimide resin and the like.

In the emission region EA of each of the sub-pixels SP, the first electrode, the organic light emitting layer, and the second electrode are sequentially stacked and holes from the first electrode and electrons from the second electrode are combined with each other in the organic light emitting layer to emit light.

The organic light emitting layer is disposed on the first electrode and the pixel defining layer. The organic light emitting layer may include an organic material to emit a predetermined color. For example, the organic light emitting layer may include a bole transporting layer, an organic material layer, and an electron transporting layer. Among the sub-pixels SP, the organic light emitting layer of a first sub-pixel emits light of a first color, the organic light emitting layer of a second sub-pixel emits light of a second color, and the organic light emitting layer of a third sub-pixel emits light of a third color. Alternatively, the organic light emitting layers of the sub-pixels SP may emit white light. In this case, the first sub-pixel may overlap a color filter layer of the first color, and the second sub-pixel may overlap a color filter layer of the second color and the third sub-pixel may overlap a color filter layer of the third color. For example, the first color may be red, the second color may be green, and the third color may be blue, but they are not necessarily limited thereto.

The second electrode is disposed on the organic light emitting layer. The second electrode may cover the organic light emitting layer. The second electrode may be a common layer commonly disposed on the sub-pixels SP. A capping layer may be disposed on the second electrode.

In the top emission structure, the second electrode may be formed of a transparent conductive material (TCO) such as ITO or IZO capable of transmitting light or a semi-transmissive conductive material such as magnesium (Mg), silver (Ag), or an alloy of magnesium (Mg) and silver (Au). When the second electrode is formed of a semi-transmissive conductive material, the light emission efficiency can be increased due to a micro-cavity effect.

The encapsulation layer may be disposed on the light emitting element layer. The encapsulation layer may include at least one inorganic layer to prevent oxygen or moisture from penetrating into the light emitting element layer. In addition, the encapsulation layer may include at least one organic layer to protect the light emitting element layer from foreign substances such as dust.

Alternatively, a substrate instead of the encapsulation layer may be disposed on the light emitting element layer, and a space between the light emitting element layer and the substrate may be empty in a vacuum state or a filling film may be disposed in the space. The filling film may be an epoxy filling film or a silicone film.

Referring to FIG. 8 again, the lower metal line BML may have widths d3 and d4. The widths d3 and d4 of the lower metal line BML may be, for example, about 2.4 μm or more.

The lower metal line BML may overlap the initialization voltage line VIL. According to an exemplary embodiment of the present disclosure, the widths d3 and d4 of the lower metal line BML may be the same as the width of an overlapping portion between the lower metal line BML and the initialization voltage line VIL.

As the widths d3 and d4 of the lower metal line BML are the same as the width of the overlapping portion between the lower metal line BML and the initialization voltage line VIL, an area of the overlapping portion between the lower metal line BML and the initialization voltage line VIL may be minimized.

In addition, the lower metal line BML may overlap the data line Dj. The width of an overlapping portion between the lower metal line BML and the data line Dj may be 10% or less of the width of the data line Dj. As the width of the overlapping portion between the lower metal line BML and the data line Dj is 10% or less of the width of the data line Dj, an area of the overlapping portion between the lower metal line BML and the data line Dj may be minimized.

Figure 10:
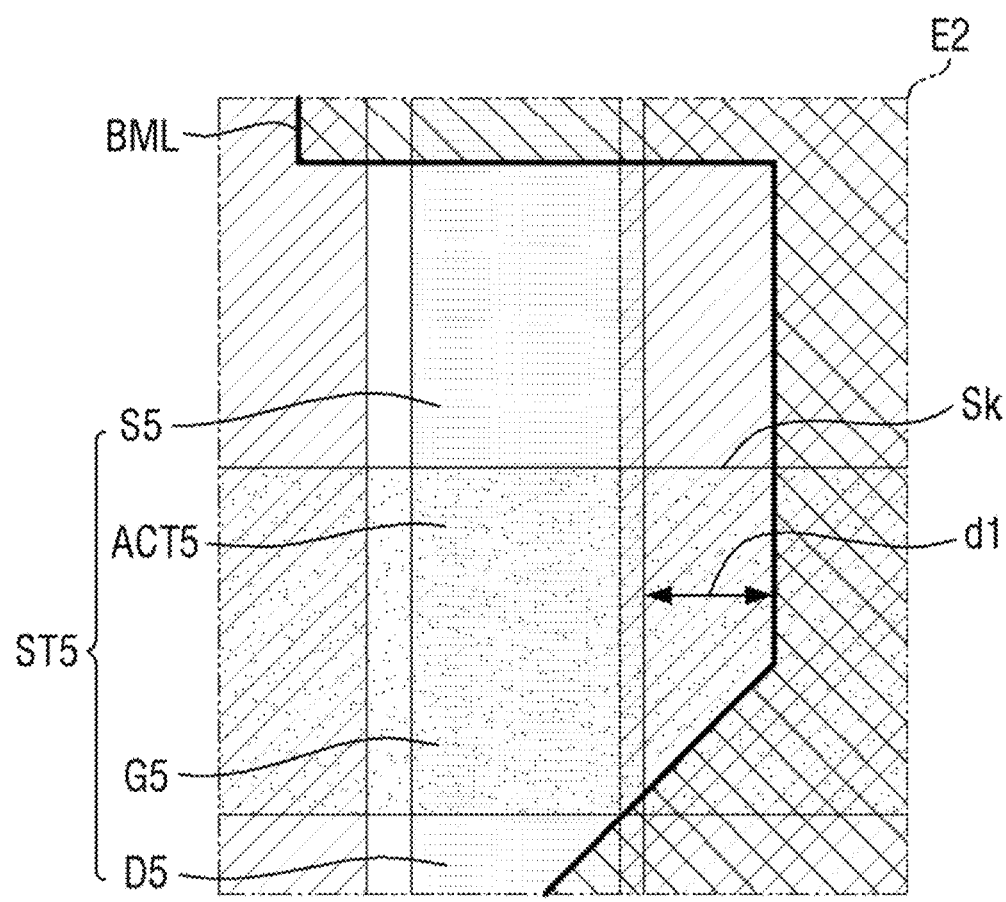
FIG. 10 is an enlarged view of area E2 of FIG. 8.

FIG. 10 is an enlarged view of area E2 of FIG. 8.

Referring to FIGS. 8 and 10, the active layer ACT5 of the fifth transistor ST5 and the lower metal line BML may be separated (e.g. spaced apart from each other). For example, a separation width d1 between the active layer ACT5 of the fifth transistor ST5 and the lower metal line BML may be 50% or more of the width d3, d4 of the lower metal line BML.

For example, the separation width d1 between the active layer ACT5 of the fifth transistor ST5 and the lower metal line BML may be about 1.9 μm or more.

Figure 11:
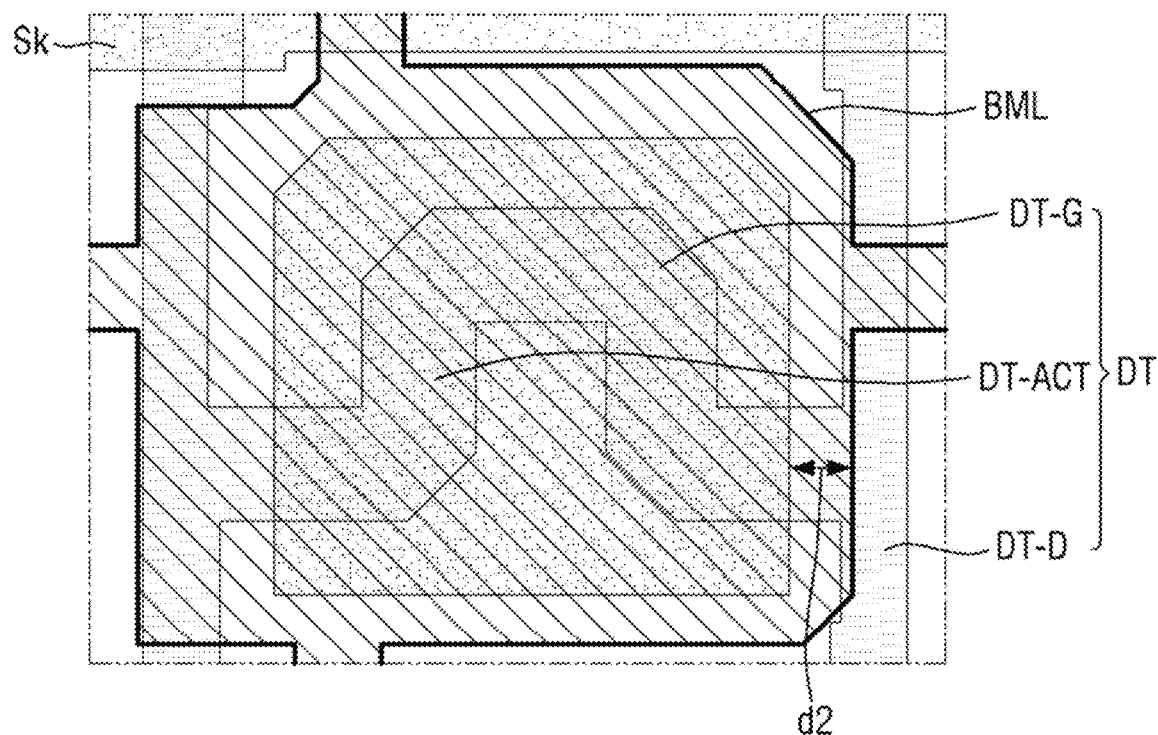
FIG. 11 is a diagram showing a region in which the gate electrode of the driving transistor of FIG. 8 is disposed.

FIG. 11 is a diagram showing a region in which the gate electrode of the driving transistor of FIG. 8 is disposed.

Referring to FIGS. 8 and 11, the lower metal line BML may extend outward against the gate electrode DT-G of the driving transistor DT in a plait view. In addition, an extension width d2 of the lower metal line BML extending outward against the gate electrode DT-G of the driving transistor DT may be smaller than the separation width d1, which has been described above with reference to FIG. 10, between the active layer ACT5 of the fifth transistor ST5 and the lower metal line BML and may be greater than 50% of the width d3, d4 of the lower metal line BML. For example, the extension width d2 of the lower metal line BML extending outward against the gate electrode DT-G of the driving transistor DT may be about 1.75 μm, but is not necessarily limited thereto.

Figure 12:
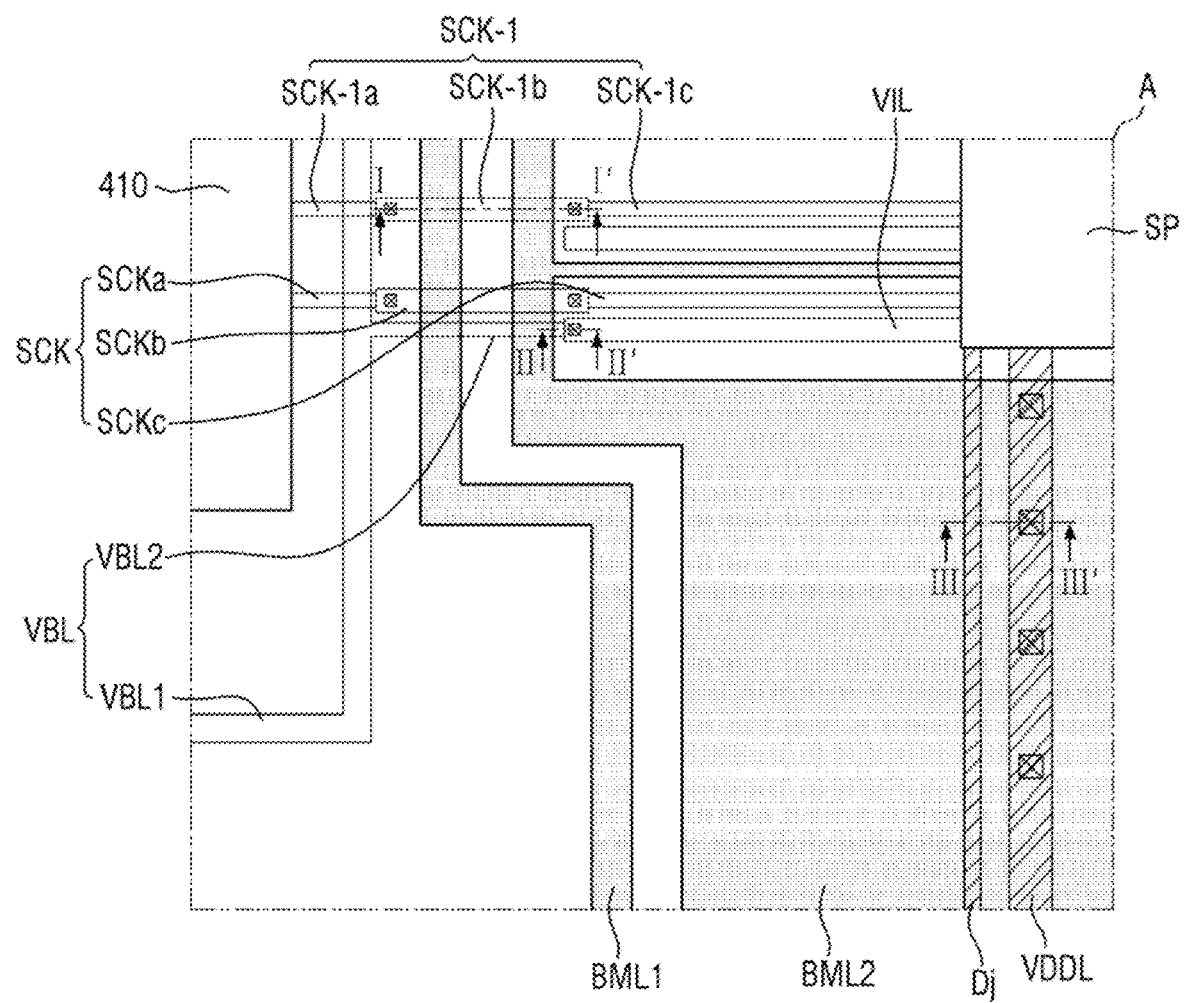
FIG. 12 is an enlarged view of region A of FIG. 5.

FIG. 12 is an enlarged view of region A of FIG. 5. FIG. 13 is a cross-sectional view taken along line I-I' of FIG. 12. FIG. 14 is a cross-sectional view taken along line of FIG. 12. FIG. 15 is a cross-sectional view taken along line III-III' of FIG. 12.

Referring to FIGS. 12 to 15 together with FIG. 5, each of the first lower metal line BML1 and the second lower metal line BML2 may extend upward, be bent to extend to the left, and then extend again upward in the drawing. While extending again upward, the second lower metal line BML2 may be branched to extend to the right. The branch portion of the second lower metal line BML2 extending to the right may be electrically connected to the sub-pixel SP.

Initialization bus lines VBL may include a first initialization bus line VBL1 and a second initialization bus line VBL2.

The first initialization bus line VBL1 may extend to the right, and then be bent to extend upward. The second initialization bus line VBL2 may be branched in the middle of the first initialization bus line VBL1 that extends upward, and may extend to the right. The second initialization bus line VBL2 may be connected to the initialization voltage line VIL. The initialization bus lines VBL may be disposed on the first data metal layer. In some exemplary embodiments of the present disclosure, the initialization bus lines VBL may be disposed on the second data metal layer.

The second initialization bus line VBL2 may cross the lower metal lines BML1 and BML2. The second initialization bus line VBL2 may overlap the lower metal lines BML1 and BML2.

According to an exemplary embodiment of the present disclosure, although the second initialization bus line VBL2 overlaps the lower metal lines BML1 and BML2, the initialization bus lines VBL are disposed on the first data metal layer, thereby increasing the separation distance from the lower metal lines BML1 and BML2 in the thickness direction.

Scan connection lines SCk-1 and SCk may electrically connect the scan signal output unit 410 to the sub-pixel SP. The scan connection line SCk-1, SCk may include a first scan connection line SCk-1a SCka connected to the scan signal output unit 410, a second scan connection line SCk-1c, SCkc connected to the scan line Sk-1, Sk of the sub-pixel SP, and a third scan connection line SCk-1b, SCkb that connects the first scan connection line SCk-1a, SCka to the second scan connection line SCk-1c, SCkc.

The first scan connection lines SCk-1a and SCka and the second scan connection lines SCk-1c and SCkc may be disposed on the second gate layer, and the third scan connection lines SCk-1b and SCkb may be disposed on the first data metal layer. The third scan connection lines SCk-1b and SCkb may intersect the lower metal lines BML1 and BML2 and overlap them in the thickness direction.

According to an exemplary embodiment of the present disclosure, the third scan connection lines SCk-1b and SCkb which intersect the lower metal lines BML1 and BML2 and overlap them in the thickness direction, are disposed on the first data metal layer, thereby increasing the separation distance in the thickness direction between the lower metal lines BML1 and BML2 and the third scan connection lines SCk-1b and SCkb which intersect the lower metal lines BML1 and BML2 and overlap them in the thickness direction.

In some exemplary embodiments of the present disclosure, the first scan connection lines SCk-1a and SCka and the second scan connection lines SCk-1c and SCkc may be disposed on the first gate layer.

In some exemplary embodiments of the present disclosure, the first scan connection lines SCk-1a and SCka may be disposed on the first gate layer, and the second scan connection lines SCk-1c and SCkc may be disposed on the second gate layer, and vice versa.

In some exemplary embodiments of the present disclosure, the third scan connection lines SCk-1b and SCkb may be disposed on the second data metal layer.

According to an exemplary embodiment of the present disclosure, the data line Dj and the first driving voltage line VDDL may be disposed on the first data metal layer. The data line Dj and the first driving voltage line VDDL may overlap the second lower metal line BML2 in the thickness direction. However, as described above, the data line Dj and the first driving voltage line VDDL are disposed on the first data metal layer, so that the separation distance in the thickness direction, between the second lower metal line BML2 and each of the data line Dj and the first driving voltage line VDDL that overlap the second lower metal line BML2 in the thickness direction, may increase.

Figure 15:
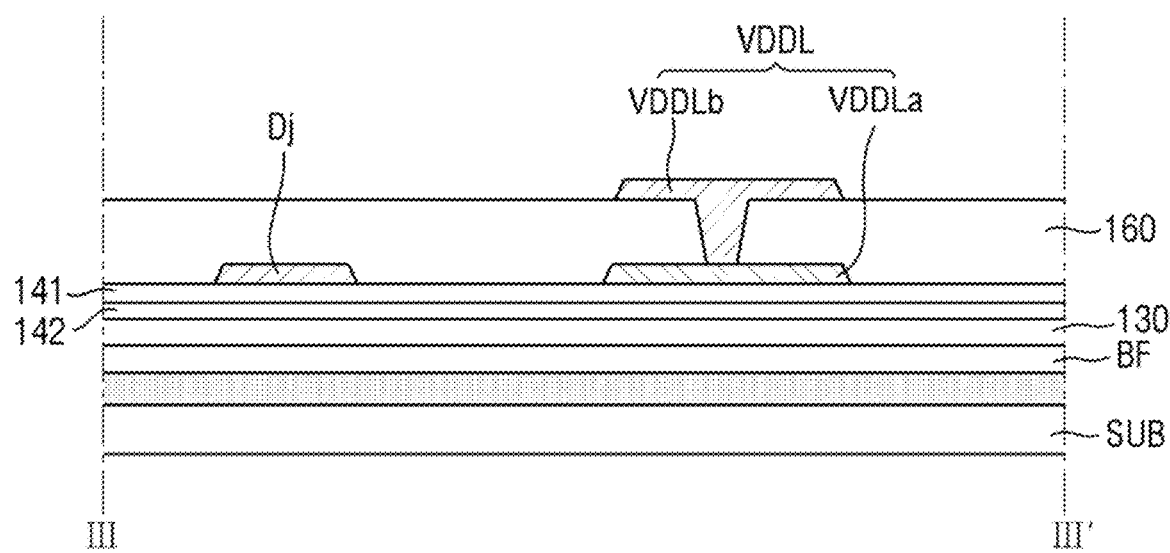
FIG. 15 is a cross-sectional view taken along line III-III' of FIG. 12.

In some exemplary embodiments of the present disclosure, as illustrated in FIG. 15, the first driving voltage line VDDL may include a first driving voltage line portion VDDLa disposed on the first data metal layer and a second driving voltage line portion VDDLb disposed on the second data metal layer and connected to the first driving voltage line portion VDDLa.

Figure 16:
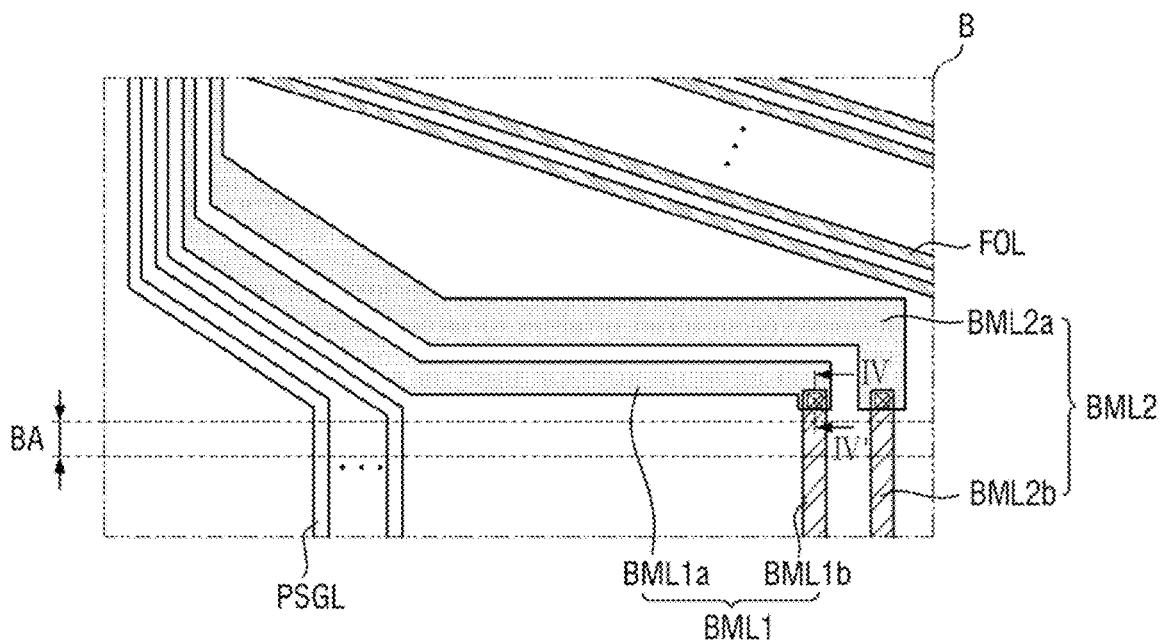
FIG. 16 is an enlarged view of region B of FIG. 5.
Figure 17:
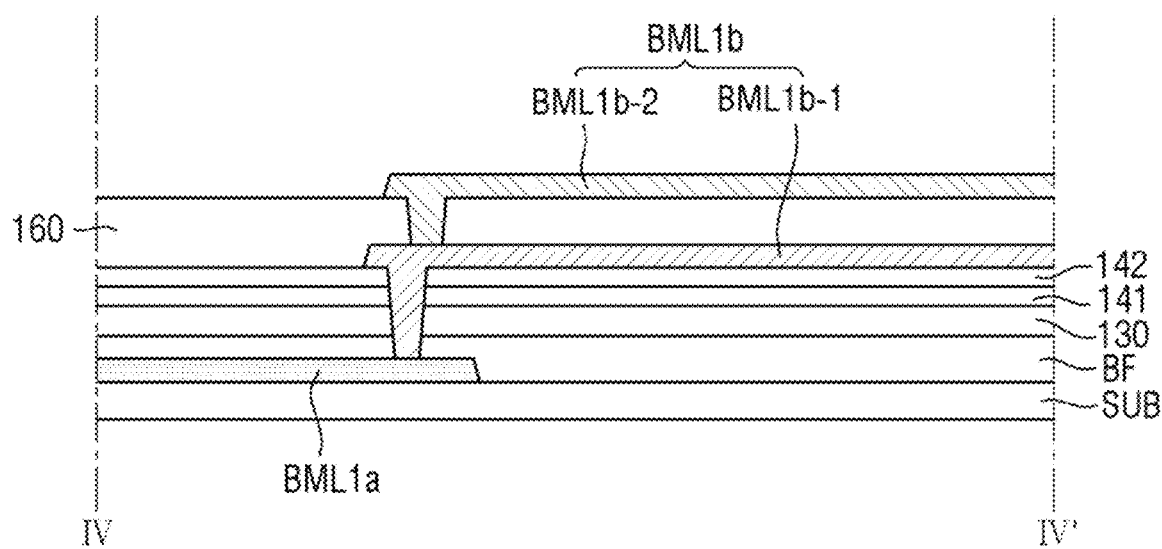
FIG. 17 is a cross-sectional view taken along line IV-IV' of FIG. 16.

FIG. 16 is an enlarged view of region B of FIG. 5. FIG. 17 is a cross-sectional view taken along line IV-IV of FIG. 16.

Referring to FIGS. 16 and 17, a scan control line PSGL is connected to the scan driver (see 410 of FIG. 4) to provide a scan control signal (see SCS of FIG. 4) to the scan signal output unit 410. The scan control line PSGL may be disposed on the first gate layer. In some exemplary embodiments of the present disclosure, the scan control line PSGL may be disposed on the second gate layer.

Further, a fan-out line FOL outputs the data voltage to the data lines Dj. Between the bending area BA and the display area DA in a plan view, the lower metal lines BML1 and BML2 may be disposed between the scan control line PSGL and the fan-out line FOL. For example, between the bending area BA and the display area DA in a plan view, the lower metal lines BML1 and BML2 are disposed between the scan control line PSGL and the fan-out line FOL, thereby minimizing the crosstalk in the lower metal lines BML1 and BML2 due to the scan control line PSGL and the fan out line FOL.

Further, the lower metal line BML1, BML2 may include a first lower metal line portion BML1a, BML2a, and a second lower metal line portion BML1b, BML2b connected to the first lower metal line portion BML1a, BML2a. The second lower metal line portions BML1b and BML2b may extend upward, and the first lower metal line portions BML1a and BML2a may extend leftward.

The second lower metal line portions BML1b and BML2b may pass through the bending area BA. The second lower metal line portions BML1b and BML2b may overlap the bending area BA.

The first lower metal line portions BML1a and BML2a may be disposed between the buffer film BF and the substrate SUB, and the second lower metal line portions BML1b and BML2b may be disposed on the data metal layers (the first data metal layer and the second data metal layer).

According to an exemplary embodiment of the present disclosure, the second lower metal line portions BML1b and BML2b are disposed on the data metal layers (the first data metal layer and the second data metal layer), thereby preventing the second lower metal line portions BML1b and BML2b from being disconnected in the bending area BA.

Referring to FIG. 17, the second lower metal line portion BML1b may include a second-first lower metal line portion BML1b-1 disposed on the first data metal layer, and a second-second lower metal line portion BML1b-2 disposed on the second data metal layer. The second-first lower metal line portion BML1b-1 and the second-second lower metal line portion BML1b-2 may be electrically connected to each other and may overlap each other in the thickness direction.

According to an exemplary embodiment of the present disclosure, the second-first lower metal line portion BML1b-1 and the second-second lower metal line portion BML1b-2 are electrically connected to each other and to overlap each other in the thickness direction, thereby preventing the second lower metal line portion b from being disconnected in the bending area BA.

Figure 18:
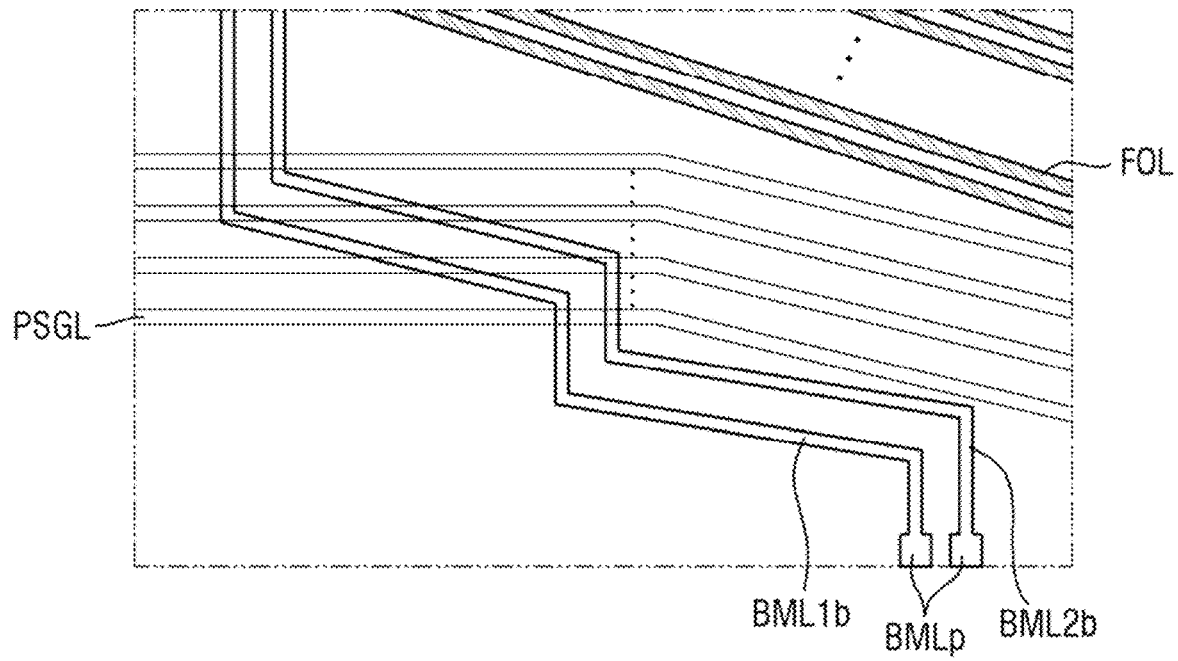
FIG. 18 is a plan view illustrating a lower side of the bending area of the display panel according to an exemplary embodiment of the present disclosure.

FIG. 18 is a plan view illustrating a lower side of the bending area of the display panel according to an exemplary embodiment of the present disclosure.

Referring to FIGS. 18 and 5, the second lower metal line portions BML1b and BML2b may respectively form lower metal pads BMLp in the second pad area. The second lower metal line portions BML1b and BML2b may be configured to receive a constant voltage from the lower metal pads BMLp located in the pad area.

As described above, the second lower metal line portions BML1b and BML2b may be disposed on a first data conductive or on a second data conductive layer. The lower metal pads BMLp may be disposed on the same layer as the second lower metal line portions BML1b and BML2b, but are not necessarily limited thereto.

The second lower metal line portions BML1b and BML2b may extend in a stepwise manner along the upper left direction, but are not necessarily limited thereto. The second lower metal line portions BML1b and BML2b may intersect the scan control line PSGL in a plan view. The second lower metal line portions BML1b and BML2b may overlap the scan control line PSGL in the thickness direction.

According to an exemplary embodiment of the present disclosure, the second lower metal line portions BML1b and BML2b are disposed on the first data conductive layer or on the second data conductive layer, and are disposed on a layer different from the scan control line PSGL and as far as possible from the scan control line PSGL in the thickness direction, thereby minimizing the crosstalk due to the scan control line PSGL.

Figure 19:
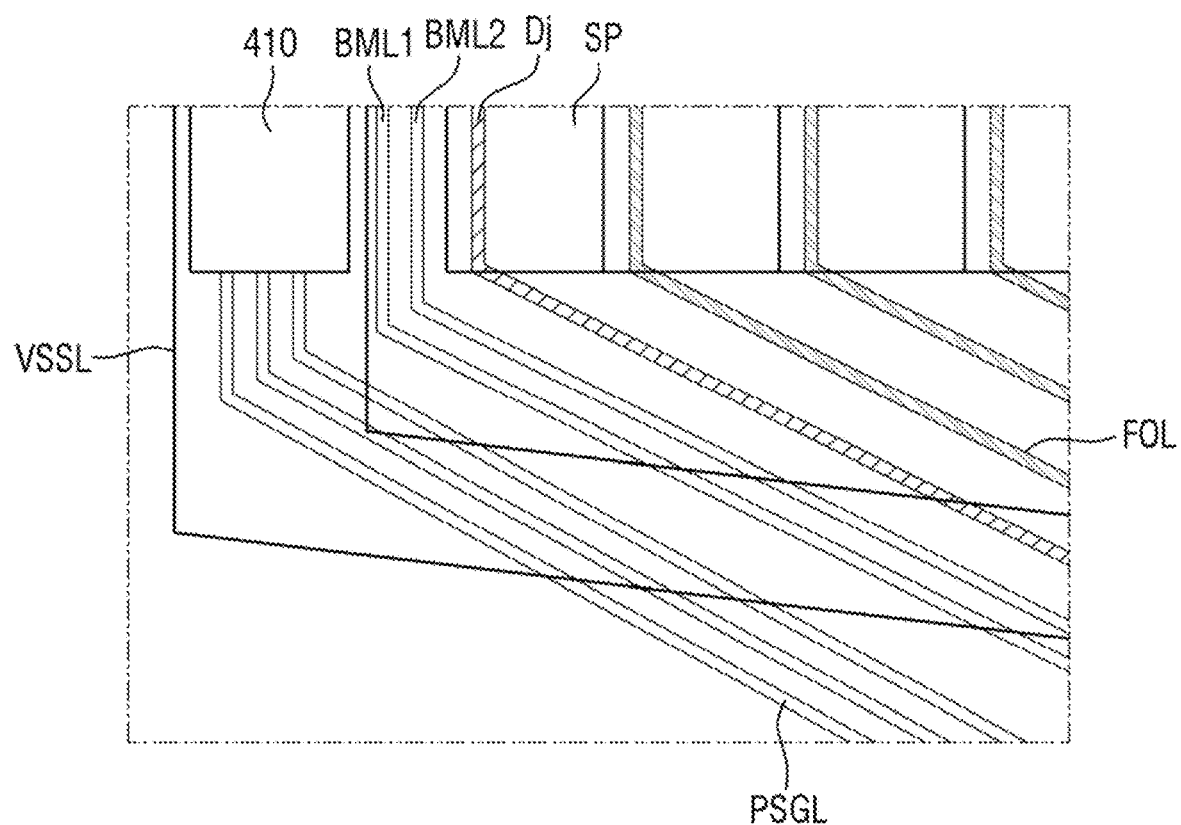
FIG. 19 is a plan view illustrating a region between the display area and the bending area of the display panel according to an exemplary embodiment of the present disclosure.

FIG. 19 is a plan view illustrating a region between the display area and the bending area of the display panel according to an exemplary embodiment of the present disclosure.

Referring to FIGS. 19 and 5, the second driving voltage line VSSL may cover the scan control line PSGL.

For example, the second driving voltage line VSSL may extend leftward, and then may be bent to extend upward.

According to an exemplary embodiment of the present disclosure, the second driving voltage line VSSL covers the scan control line PSGL, thereby reinforcing the power of the second driving voltage.

Hereinafter, a display device according to an exemplary embodiment of the present disclosure will be described. In the following embodiment, the same components as those of the above-described embodiment are denoted by the same reference numerals, and a description thereof will be omitted or simplified. Accordingly, to the extent that a description of various elements has been omitted or simplified, it may be assumed that this description is at least similar to the description of corresponding elements provided elsewhere in this disclosure.

Figure 20:
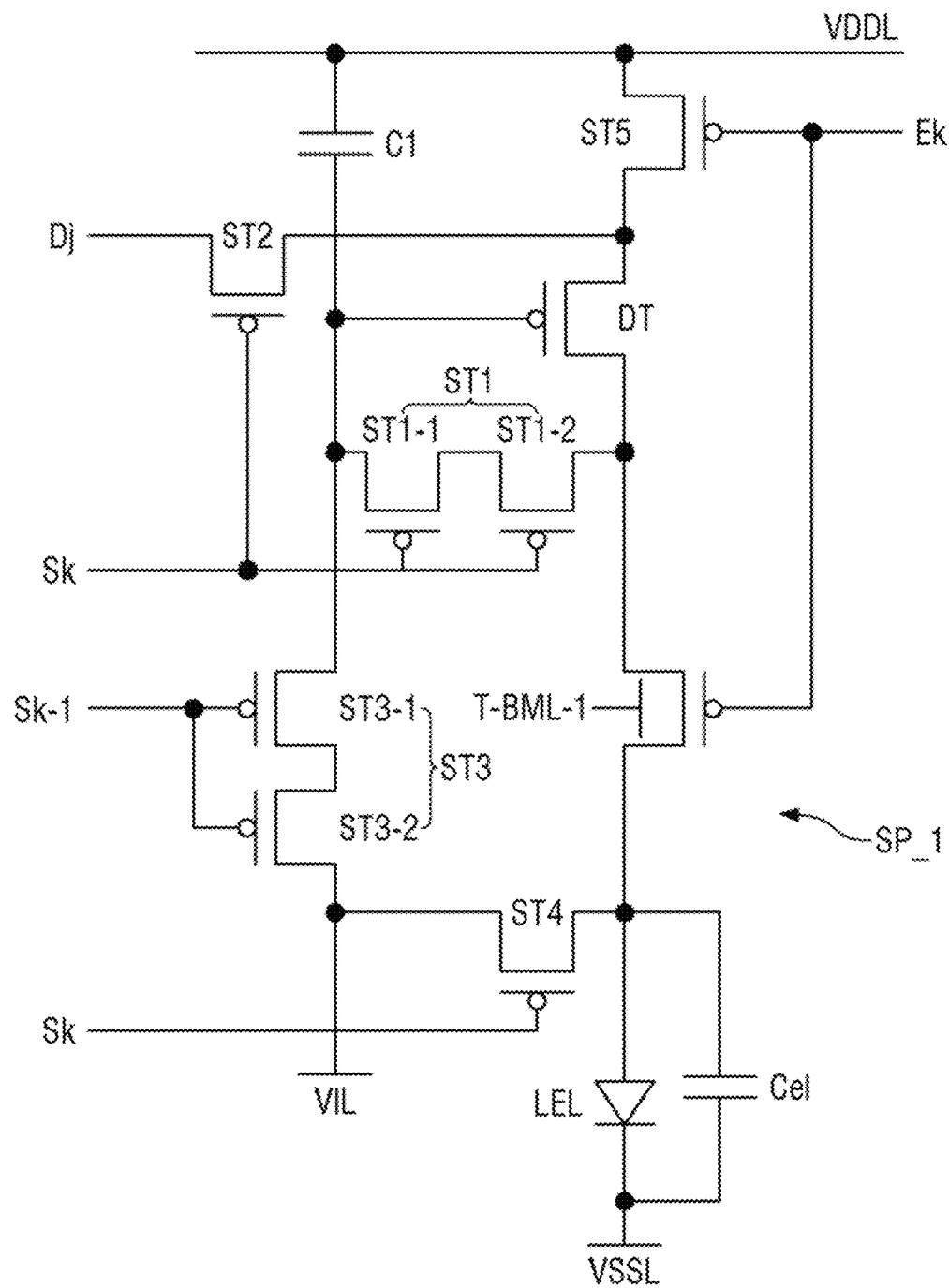
FIG. 20 is a circuit diagram specifically illustrating a sub-pixel according to an exemplary embodiment of the present disclosure.
Figure 21:
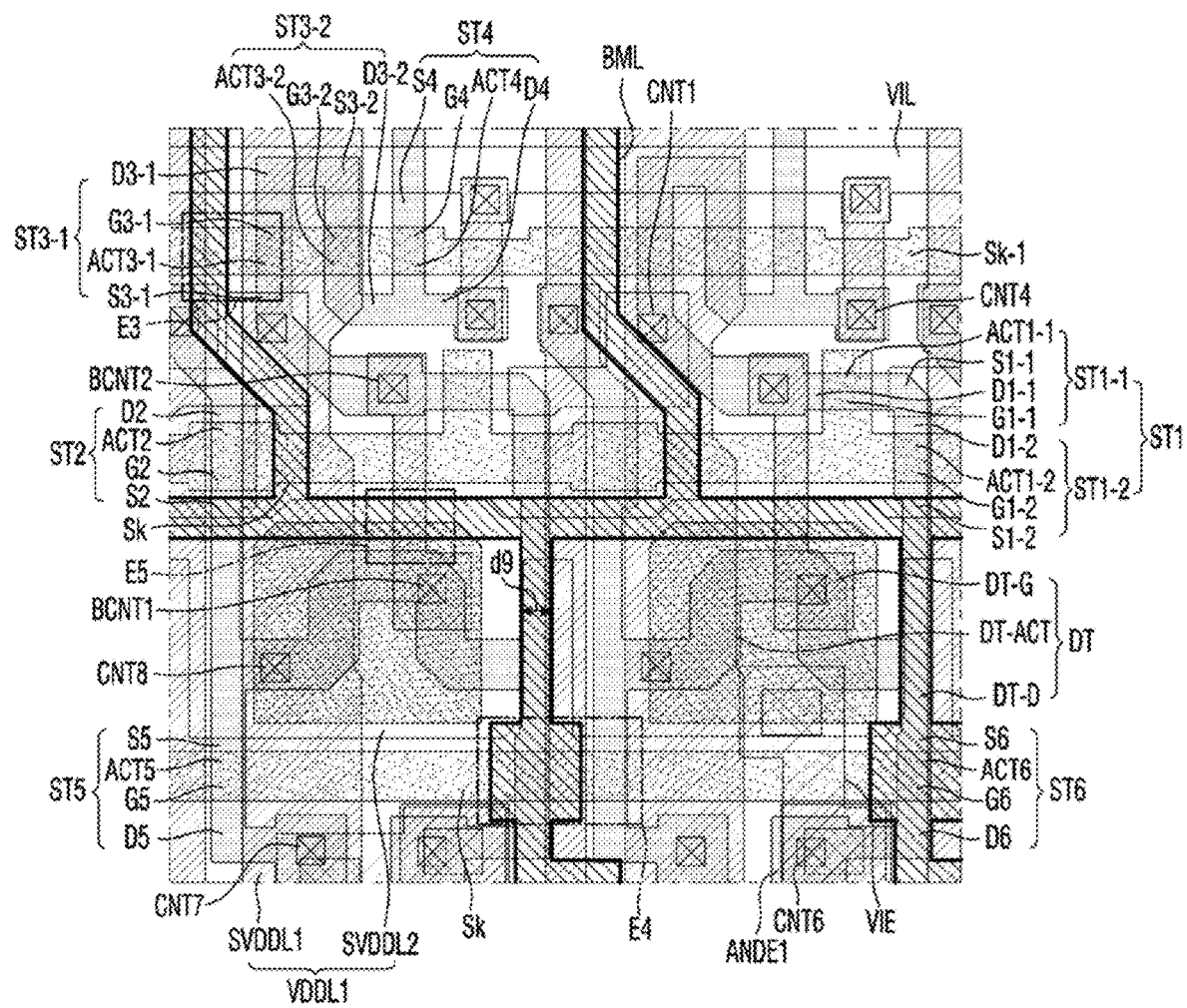
FIG. 21 is a plan view specifically illustrating a sub-pixel according to an exemplary embodiment of the present disclosure.
Figure 22:
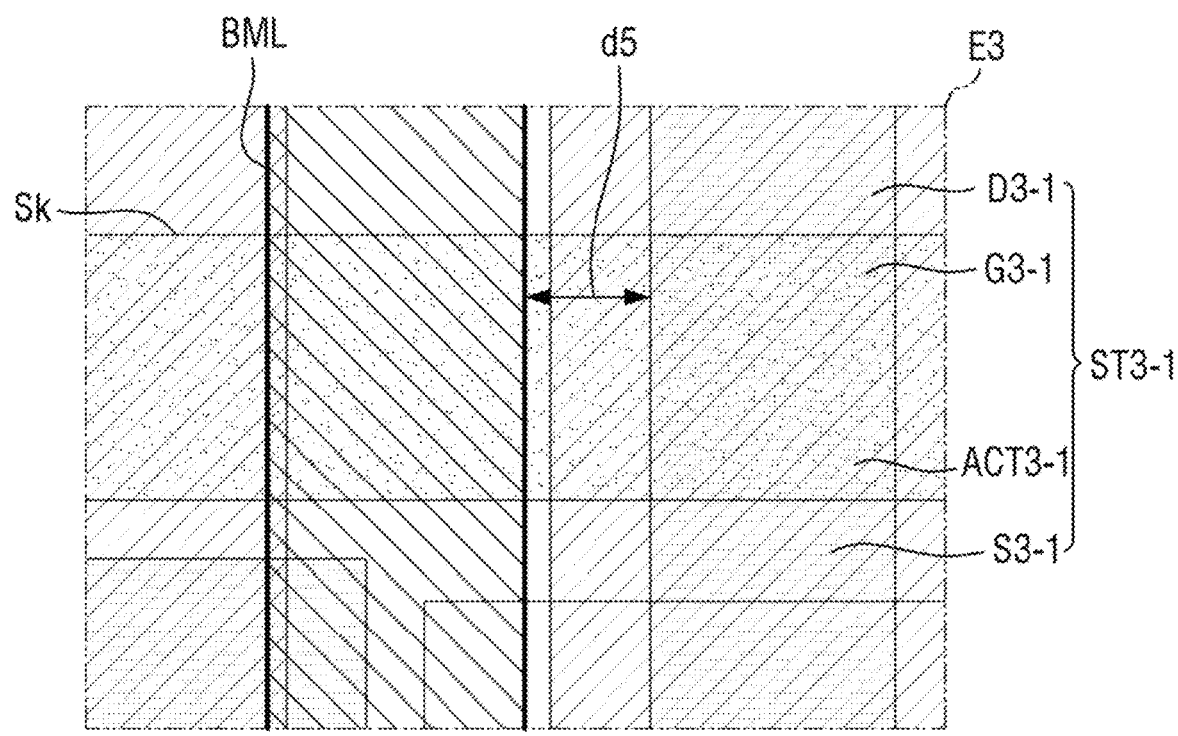
FIG. 22 is an enlarged view of area E3 of FIG. 21.
Figure 23:
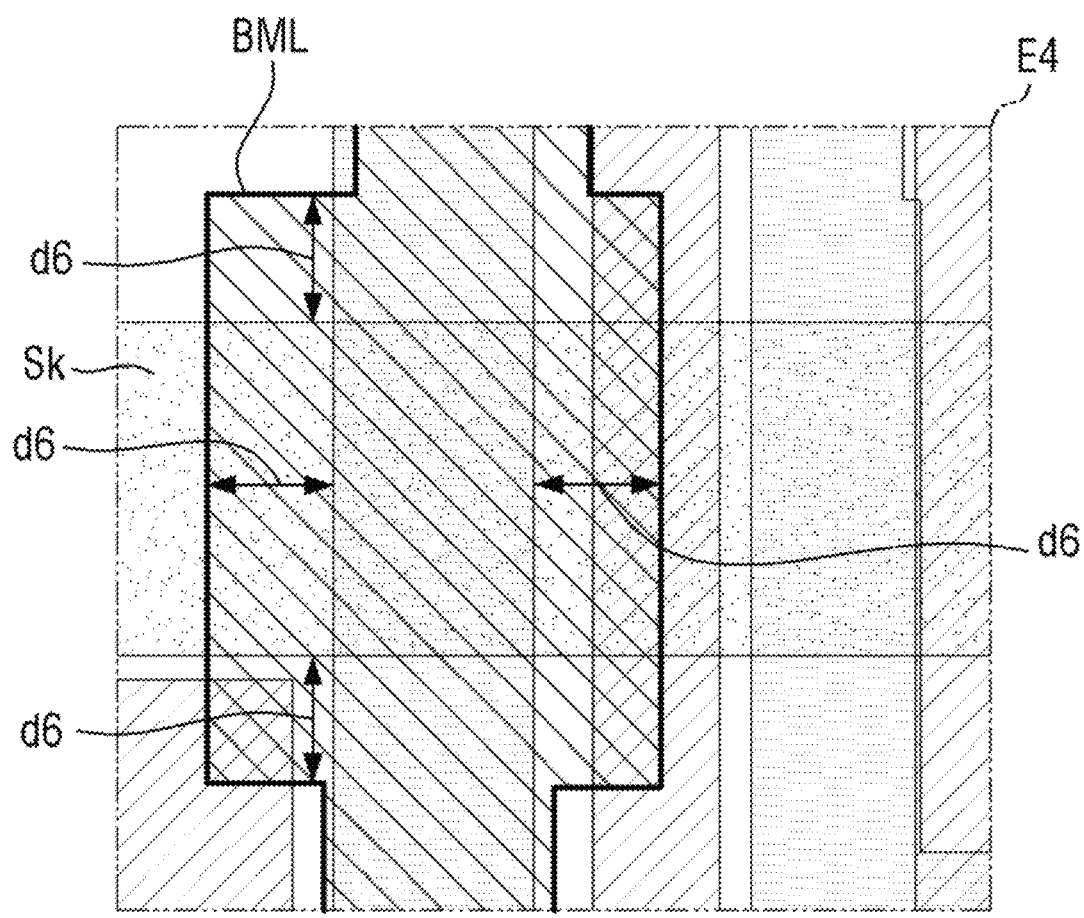
Figure 24:
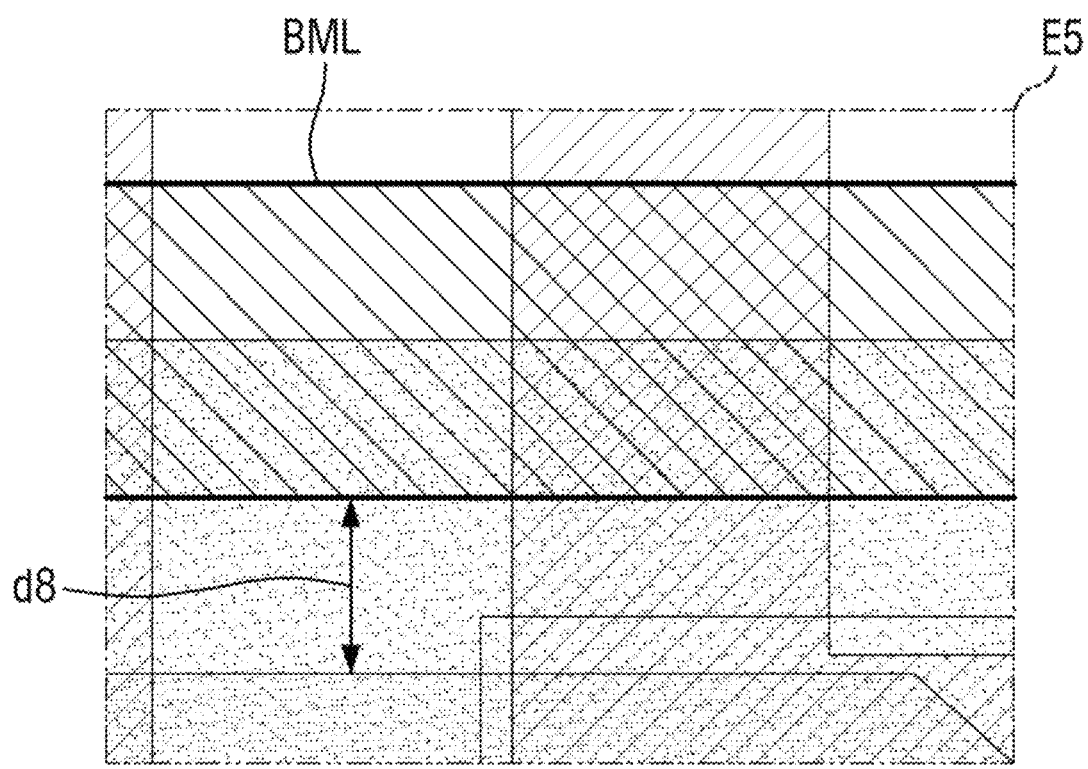
FIG. 24 is an enlarged view of area E5 of FIG. 21.

FIG. 20 is a circuit diagram specifically illustrating a sub-pixel according to an exemplary embodiment of the present disclosure. FIG. 21 is a plan view specifically illustrating a sub-pixel according to an exemplary embodiment of the present disclosure. FIG. 22 is an enlarged view of area E3 of FIG. 21. FIG. 23 is an enlarged view of area E4 of FIG. 21. FIG. 24 is an enlarged view of area E5 of FIG. 21.

Referring to FIGS. 20 to 24, a lower metal line T-BML-1 of a sub-pixel SP_1 may overlap the sixth transistor ST6. The lower metal line T-BML-1 may overlap the channel (or active) of the sixth transistor ST6, and may be spaced apart from the channels (or actives) of the first to fifth transistors ST1 to ST5 and the driving transistor DT without overlapping them.

As shown in FIGS. 20 and 22, a width d9 of the lower metal line BML may be the same as the widths d3 and d4 described above with reference to FIG. 8.

The lower metal line BML may be spaced apart from the channel ACT3-1 of the third-first transistor ST3-1 by a fifth width d5.

The fifth width d5 may be −10% to 10% of the width d9 of the lower metal line BML. For example, the fifth width d5 may be about 1.2 μm, but is not necessarily limited thereto.

According to exemplary embodiments of the present disclosure, the lower metal line BML is spaced apart from the channel ACT 3-1 of the third-first transistor ST3-1 by the fifth width d5, thereby minimizing the crosstalk in the lower metal line BML due to the third-first transistor ST3-1.

Further, as illustrated in FIGS. 20 and 23, the lower metal line BML may be larger than the sixth transistor ST6 in a plan view. The lower metal line BML may further extend upward, downward, leftward, and rightward, compared to the sixth transistor ST6. An extension width d6 of the lower metal line BML extending from the sixth transistor ST6 may be about 1.75 μm, but is not necessarily limited thereto.

In addition, as shown in FIGS. 20 and 24, the lower metal line BML may be spaced apart from the driving transistor DT in a plan view. The lower metal line BML may be spaced apart from the driving transistor DT by an eighth width d8 in a plan view. The eighth width d8 may be smaller than the fifth width d5. For example, the eighth width d8 may be about 0.85 μm, but is not necessarily limited thereto.

According to exemplary embodiments of the present disclosure, the lower metal line BML is spaced apart from the driving transistor DT in a plan view, thereby minimizing the crosstalk in the lower metal line BML due to the driving transistor DT.

Figure 25:
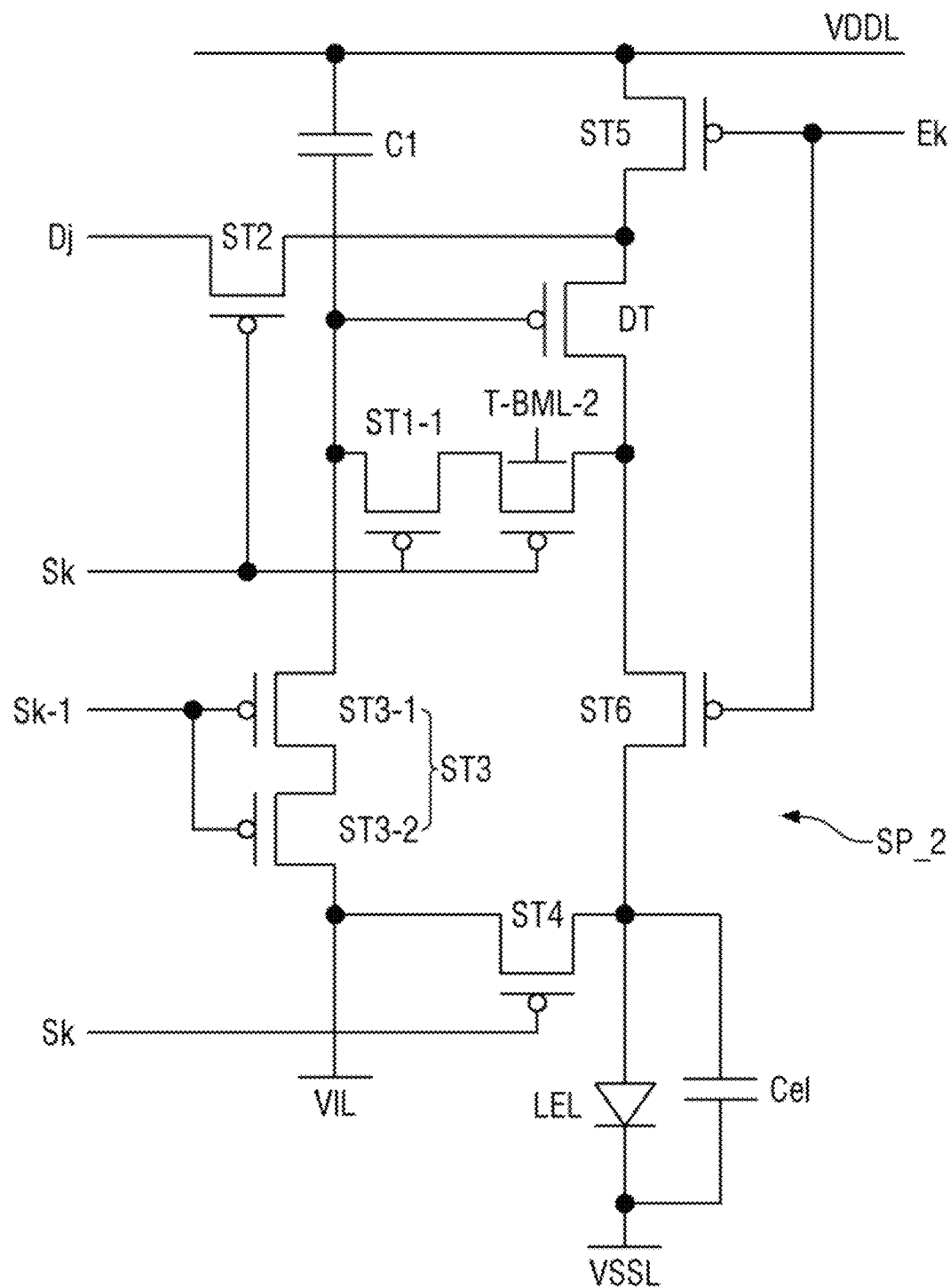
FIG. 25 is a circuit diagram specifically illustrating a sub-pixel according to an exemplary embodiment of the present disclosure.
Figure 26:
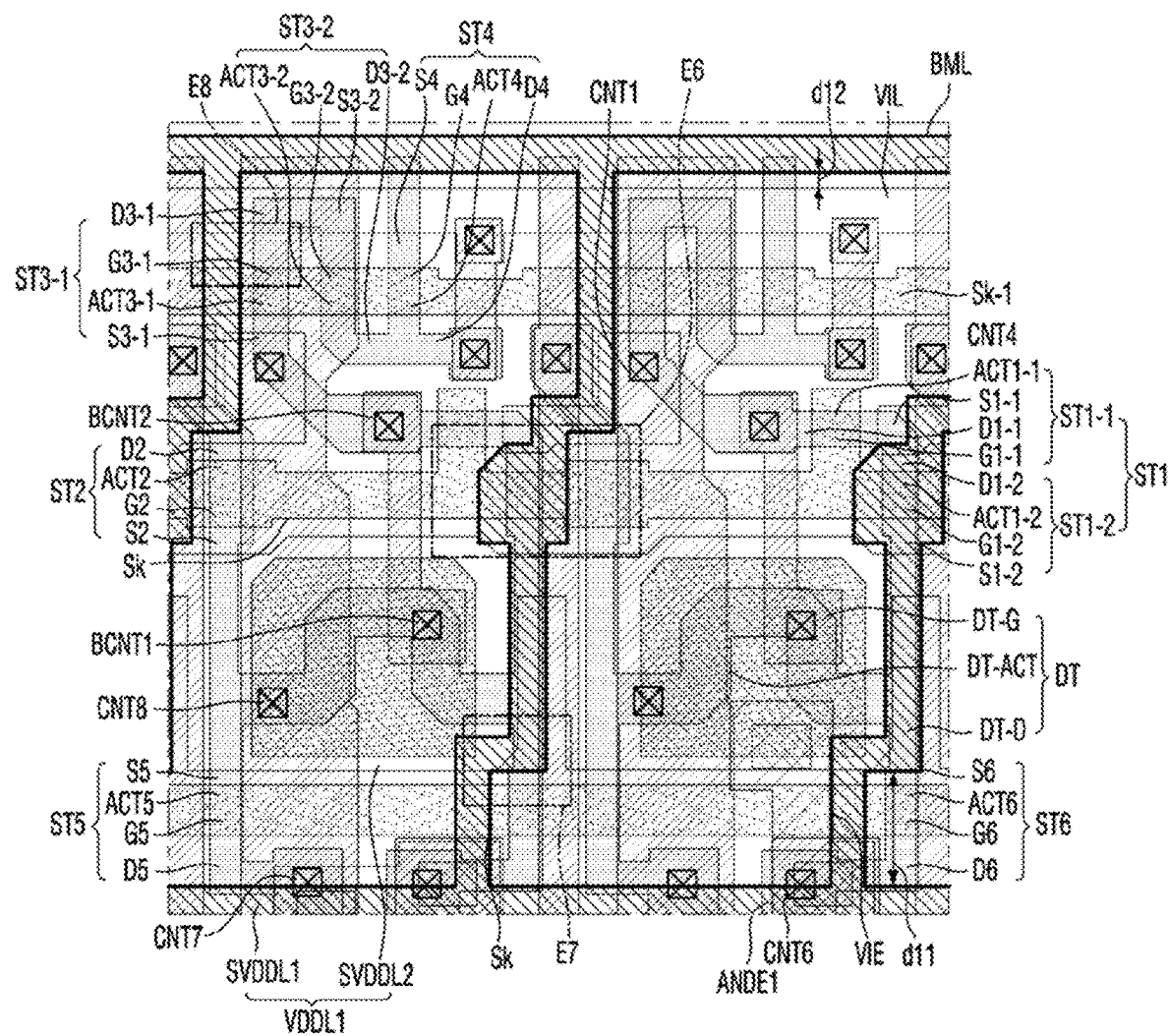
FIG. 26 is a plan view specifically illustrating a sub-pixel according to an exemplary embodiment of the present disclosure.
Figure 27:
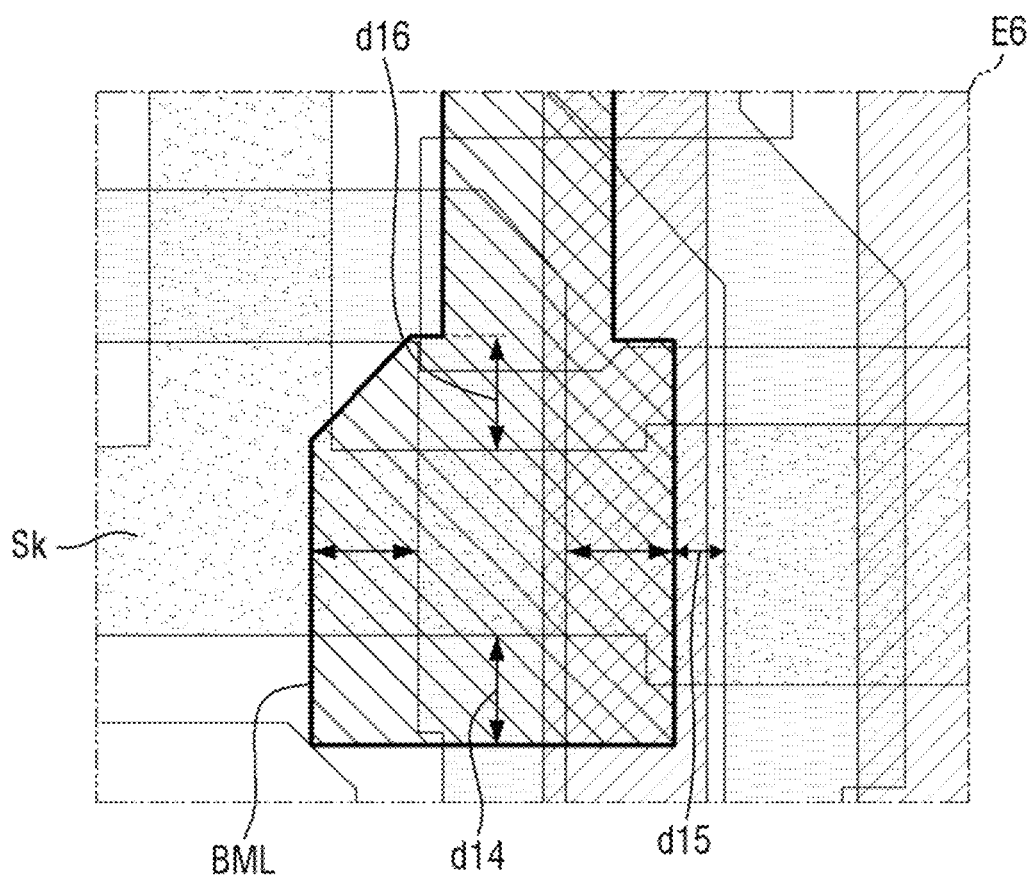
FIG. 27 is an enlarged view of area E6 of FIG. 26.
Figure 29:
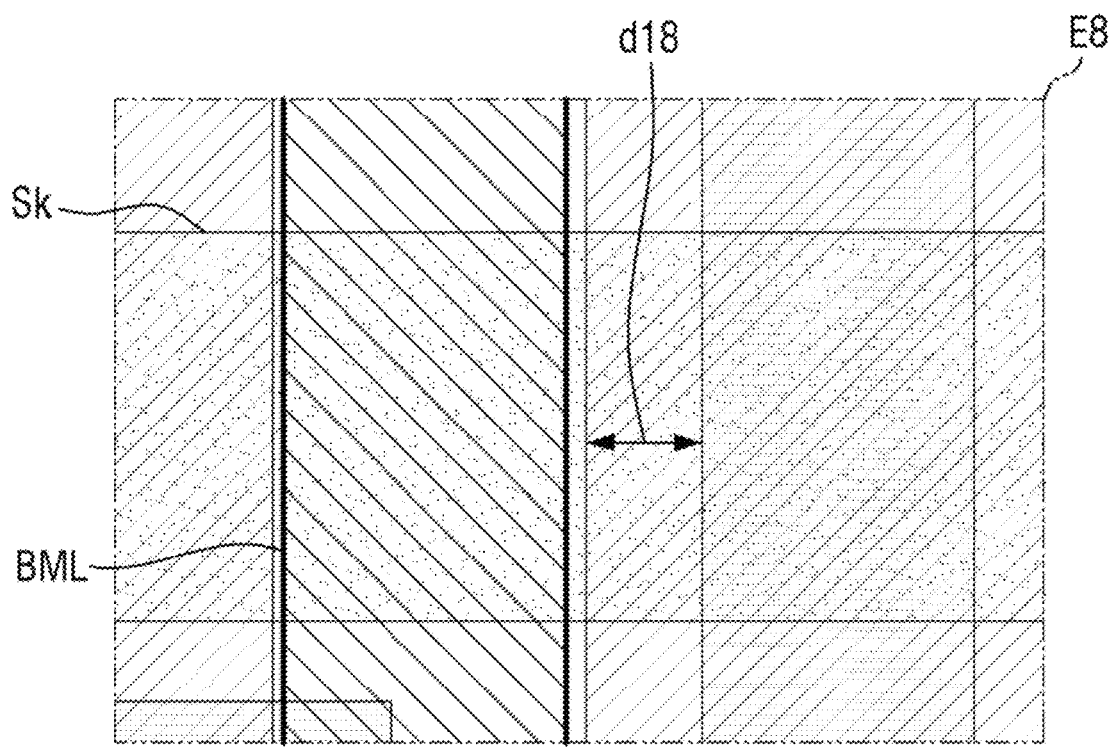
FIG. 29 is an enlarged view of area E8 of FIG. 26.

FIG. 25 is a circuit diagram specifically illustrating a sub-pixel according to an exemplary embodiment of the present disclosure. FIG. 26 is a plan view specifically illustrating a sub-pixel according to an exemplary embodiment of the present disclosure. FIG. 27 is an enlarged view of area E6 of FIG. 26. FIG. 26 is an enlarged view of area E7 of FIG. 26. FIG. 29 is an enlarged view of area E8 of FIG. 26.

Referring to FIGS. 25 to 29, a lower metal line T-BML-2 of a sub-pixel SP-2 may overlap the first-second transistor ST1-2, The lower metal line T-BML-2 may overlap the channel (or active) of the first-second transistor ST1-2, and may be spaced apart from of the channels (or actives) of the first-first transistor ST1-1, the second to fifth transistors ST2 to ST5, and the driving transistor DT, without overlapping them.

Referring to FIGS. 26 and 27, the lower metal line BML may be larger than the first-first transistor ST1-1 in a plan view. The lower metal line BML may further extend upward, downward, leftward, and rightward, compared to the first-first transistor ST1-1. The extension widths d14 and d16 of the lower metal line BML extending from the first-first transistor ST1-1 may be about 1.75 µm, but are not necessarily limited thereto.

In addition, as shown in FIGS. 26 and 27, the lower metal line BML may be spaced apart from the second transistor ST2 in a plan view. The lower metal line BML may be spaced apart from the second transistor ST2 by a fifteenth width d15 in a plan view. The fifteenth width d15 may be −10% to 10% of a width d12 of the lower metal line BML. For example, the fifteenth width d15 may be about 1.1 µm, but is not necessarily limited thereto.

According to an exemplary embodiment of the present disclosure, the lower metal line BML is spaced apart from the channel ACT2 of the second transistor ST2 by the fifteenth width d15, thereby minimizing the crosstalk in the lower metal line BML due to the second transistor ST2.

Figure 28:
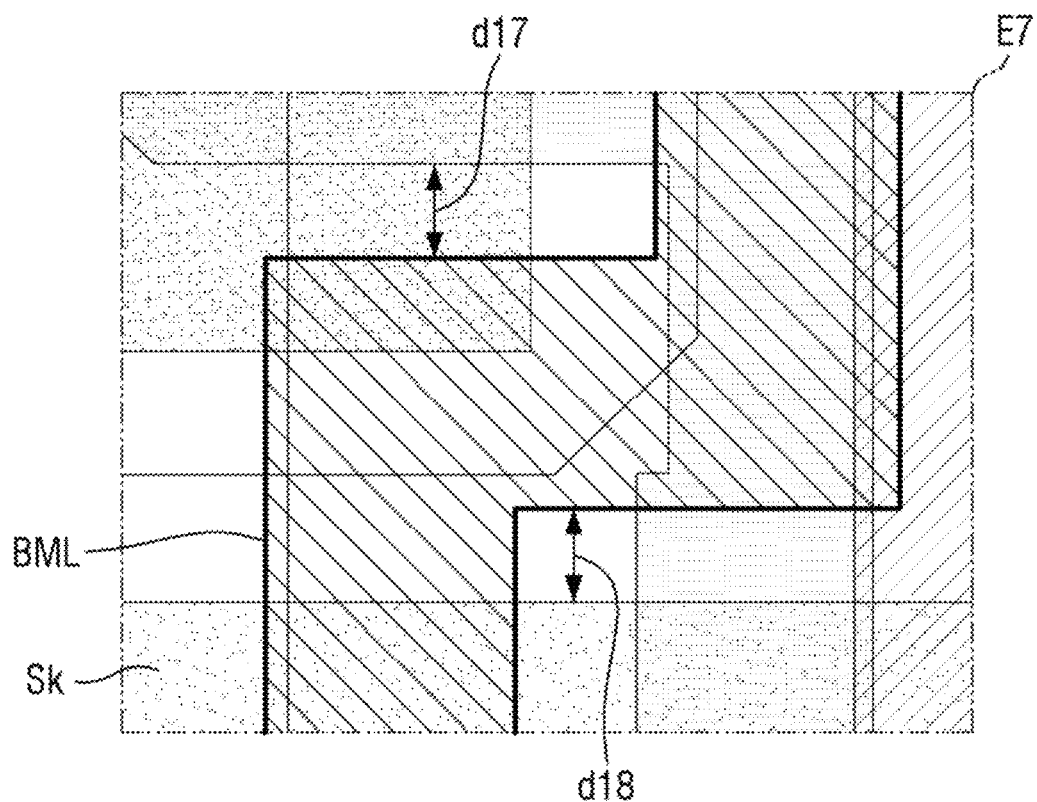
FIG. 28 is an enlarged view of area E7 of FIG. 26.

In addition, as shown in FIGS. 26 and 28, the lower metal line BML may be spaced apart from the driving transistor DT and the sixth transistor ST6 in a plan view. In a plan view, the lower metal line BML may be spaced apart from the driving transistor DT by a seventeenth width d17, and may be spaced apart from the sixth transistor ST6 by an eighteenth width d18. The seventeenth width d17 may be, for example, about 0.95 µm, but is not necessarily limited thereto. The eighteenth width d18 may be, for example, about 0.9 µm, but is not necessarily limited thereto.

According to exemplary embodiments of the present disclosure, the lower metal line BML may be disposed, in a plan view, to be spaced apart from the driving transistor DT by the seventeenth width d17, and may be spaced apart from the sixth transistor ST6 by the eighteenth width d18, thereby minimizing the crosstalk in the lower metal line BML due to the driving transistor DT and the sixth transistor ST6.

As shown in FIGS. 26 and 29, the lower metal line BML may be spaced apart from the third-second transistor ST3-2 in a plan view. The lower metal line BML may be spaced apart from the third-second transistor ST3-2 by the eighteenth width d18 in a plan view. The eighteenth width d18 may be, for example, −10% to 10% of the width d12 of the lower metal line BML. For example, the eighteenth width d18 may be about 1.1 µm, but is not necessarily limited thereto.

Figure 30:
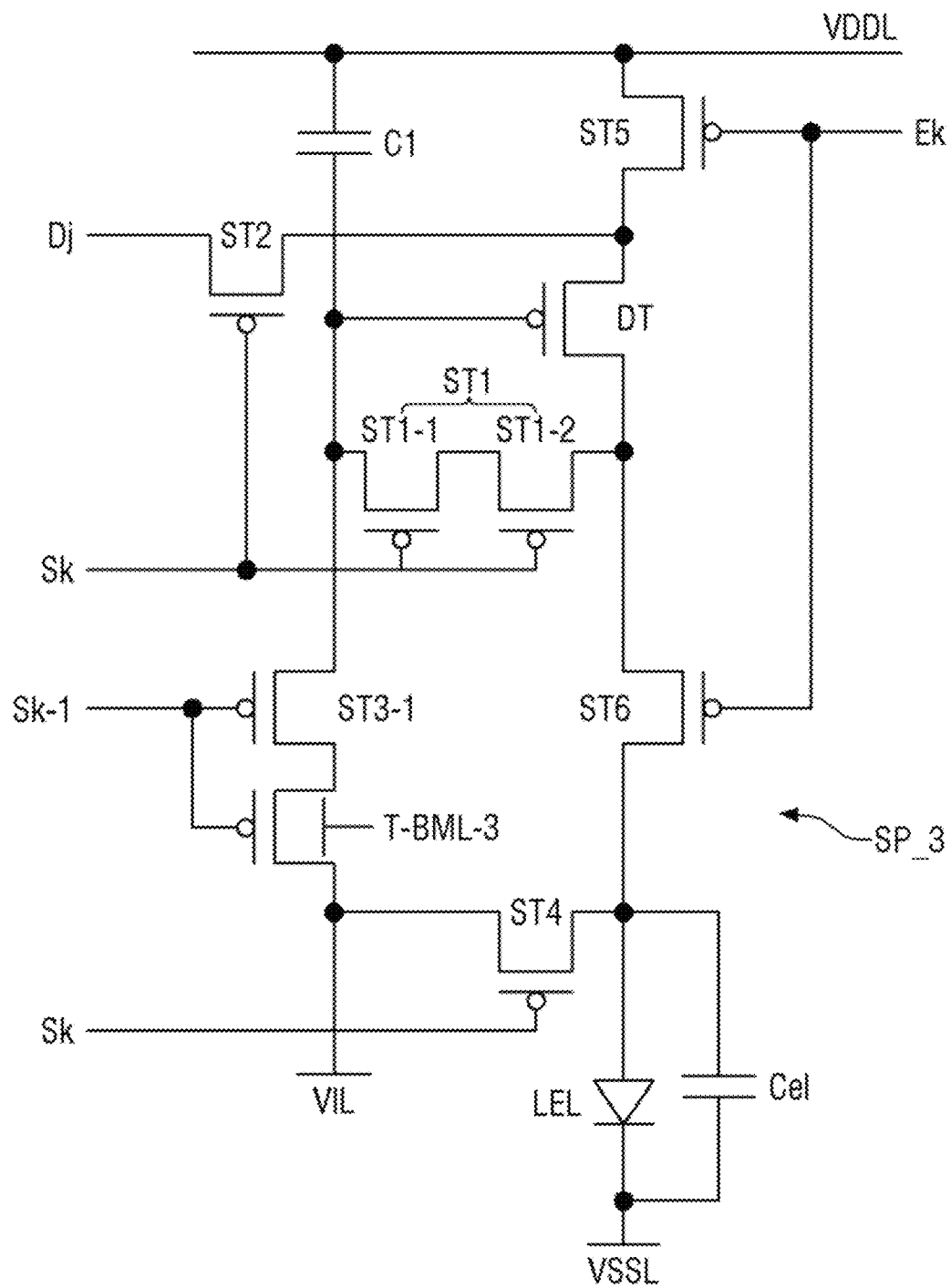
FIG. 30 is a circuit diagram specifically illustrating a sub-pixel according to an exemplary embodiment of the present disclosure.
Figure 31:
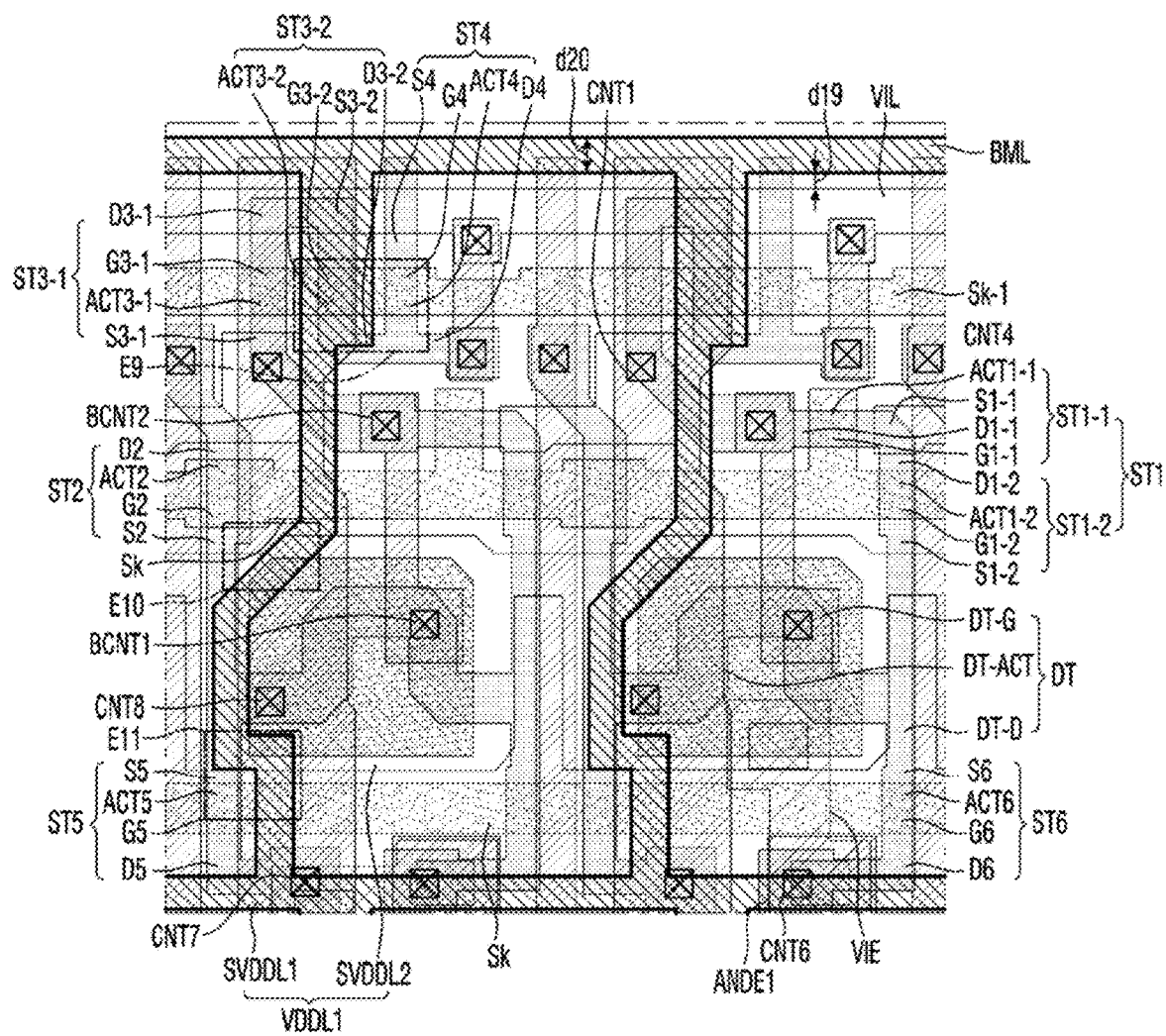
FIG. 31 is a plan view specifically illustrating a sub-pixel according to an exemplary embodiment of the present disclosure.
Figure 32:
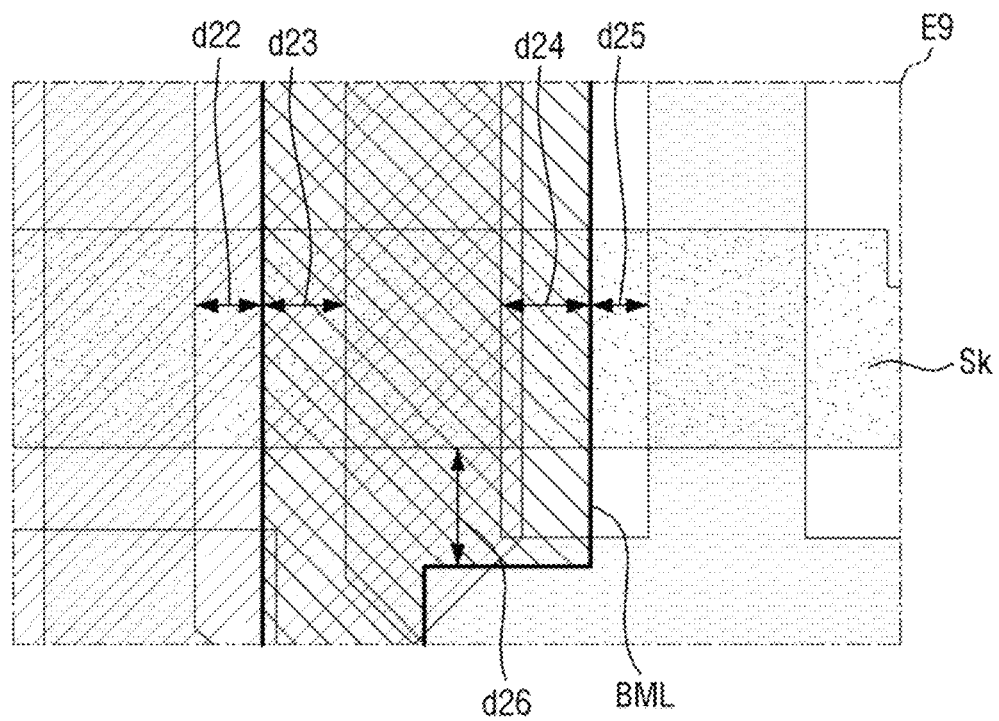
FIG. 32 is an enlarged view of area E9 of FIG. 31.
Figure 33:
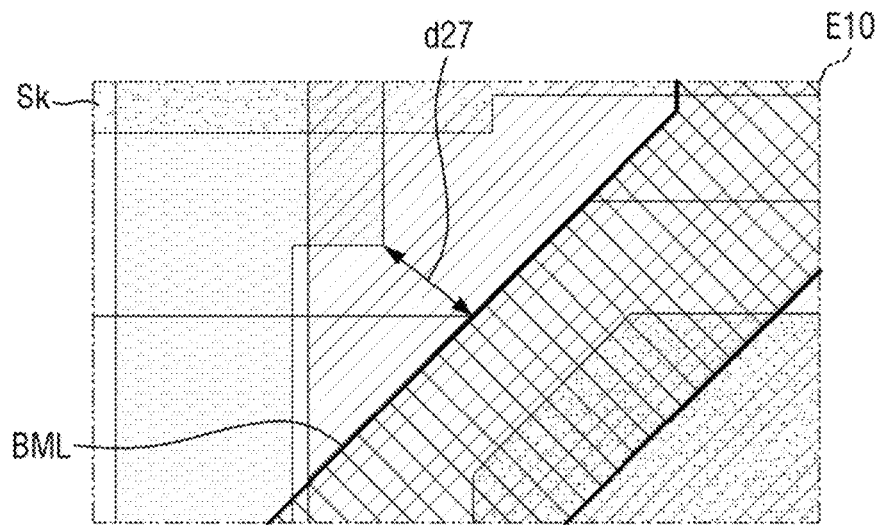
FIG. 33 is an enlarged view of area E10 of FIG. 31.
Figure 34:
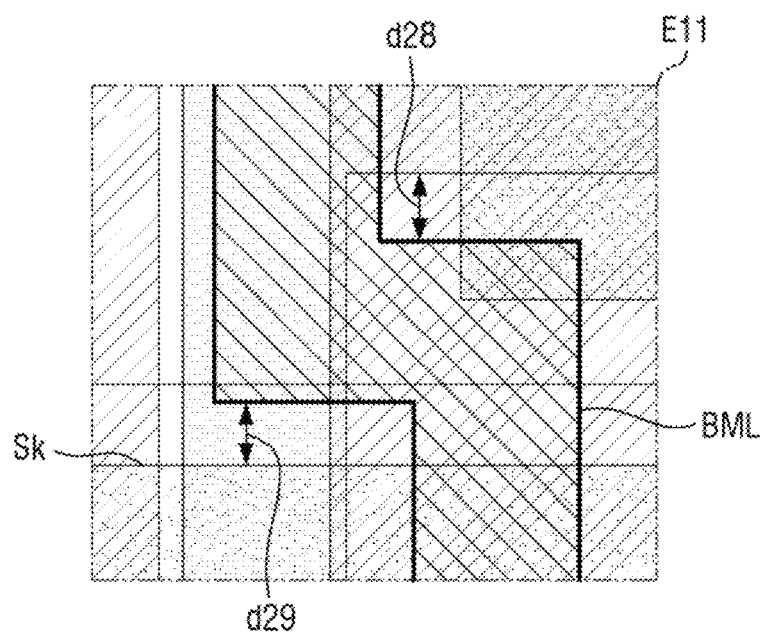
FIG. 34 is an enlarged view of area E11 of FIG. 31.

FIG. 30 is a circuit diagram specifically illustrating a sub-pixel according to an exemplary embodiment of the present disclosure. FIG. 31 is a plan view specifically illustrating a sub-pixel according to an exemplary embodiment of the present disclosure. FIG. 32 is an enlarged view of area E9 of FIG. 31. FIG. 33 is an enlarged view of area E10 of FIG. 31. FIG. 34 is an enlarged view of area E11 of FIG. 31.

Referring to FIGS. 30 to 34, a lower metal line T-BML-3 of a sub-pixel SP_3 may overlap the third-second transistor ST3-2. The lower metal line T-BML-3 may overlap the channel (or active) of the third-second transistor ST3-2, and may be spaced apart from the channels (or actives) of the third-first transistor ST3-1, the first, second, fourth and fifth transistors ST1, ST2, ST4, and ST5, and the driving transistor DT, without overlapping them.

Referring to FIGS. 31 and 32, the lower metal line BML may be larger than the channel of the third-second transistor 5T3-2 in a plan view. The lower metal line BML may further extend upward, downward, leftward, and rightward, compared to the channel of the third-second transistor ST3-2. Extension widths d23 and d24 of the lower metal line BML extending leftward and rightward from the channel of the third-second transistor ST3-2 may be about 1.25 µm, and an extension width d26 of the lower metal line BML extending downward from the channel of the third-second transistor ST3-2 may be about 1.75 µm, but they are not necessarily limited thereto.

In addition, in a plan view, the lower metal line BML may be spaced apart from the channels of the third-first transistor ST3-1 and the fourth transistor ST4 which are adjacent to the lower metal line BML. The lower metal line BML may be spaced apart from the third-first transistor ST3-1 by a twenty-second width d22 in a plan view. The twenty-second width d22 may be, for example, about 0.95 µm, but is not necessarily limited thereto. The lower metal line BML may be spaced apart from the fourth transistor ST4 by the twenty-fifth width d25. The twenty-fifth width d25 may be, for example, about 0.95 µm, but is not necessarily limited thereto.

According to exemplary embodiments of the present disclosure, the lower metal line BML is spaced apart from the channels of the third-first transistor ST3-1 and the fourth transistor ST4 which are adjacent to the lower metal line BML, thereby minimizing the crosstalk in the lower metal line BML due to the channels of the adjacent transistors ST3-1 and ST4.

As shown in FIGS. 31 and 33, in a plan view, the lower metal line BML may be spaced apart from the channel of the second transistor ST2 adjacent thereto. The lower metal line may be spaced apart from the second transistor ST2 by a twenty-seventh width d27 in a plan view. The twenty-seventh width d27 may be, for example, about 1.3 µm, but is not necessarily limited thereto.

According to exemplary embodiments of the present disclosure, the lower metal line BML is spaced apart from the channel of the second transistor ST2 adjacent thereto, thereby minimizing the crosstalk in the lower metal line BML due to the channel of the adjacent second transistor ST2.

As shown in FIGS. 31 and 34, in a plan view, the lower metal line BML may be spaced apart from the channels of the driving transistor DT and the fifth transistor ST5 which are adjacent to the lower metal line BML. The lower metal line BML may be spaced apart from the driving transistor DT by a twenty-eighth width d28 in a plan view. The twenty-eighth width d28 may be, for example, about 0.95 µm, but is not necessarily limited thereto. The lower metal line BML may be spaced apart from the fifth transistor ST5 by a twenty-ninth width d29 in a plan view. The twenty-ninth width d29 may be, for example, about 0.9 µm, but is not necessarily limited thereto.

According to exemplary embodiments of the present disclosure, the lower metal line BML is disposed, in a plan view, to be spaced apart from the channels of the driving transistor DT and the fifth transistor ST5 which are adjacent to the lower metal line BML, thereby minimizing the crosstalk in the lower metal line BML due to the channels of the adjacent transistors DT and ST5.

Although exemplary embodiments of the invention have been disclosed for illustrative purposes, those skilled in the art will appreciate that various modifications, additions and substitutions are possible, without departing from the scope and spirit of the present disclosure.

What is claimed is:

1. A display device, comprising:
   a base substrate including a display area, including a plurality of sub-pixels, and a non-display area surrounding the display area; and
   a lower metal line disposed on the base substrate and surrounding at least a portion of the display area,
   wherein each pixel of the plurality of sub-pixels includes a thin film transistor disposed on the lower metal line,
   wherein the thin film transistor includes a driving transistor and a switching transistor, each of which includes a channel, a first electrode, a second electrode, and a gate electrode overlapping the channel, and
   wherein the lower metal line overlaps only one of the channel of the driving transistor and the channel of the switching transistor.

2. The display device of claim 1, wherein the non-display area includes a pad area, and
   wherein the lower metal line is configured to receive a constant voltage from a lower metal pad located in the pad area.

3. The display device of claim 2, wherein the lower metal line includes a first lower metal line and a second lower metal line that are separated from each other, and
   wherein the second lower metal line is disposed between the first lower metal line and the display area.

4. The display device of claim 3, wherein the lower metal line overlaps the driving transistor in a thickness direction, and the lower metal line does not overlap the channel of the switching transistor.

5. The display device of claim 4, further comprising:
   a data line connected to the thin film transistor, the driving transistor, or the switching transistor and extending in a first direction,
   wherein a width of an overlap between the lower metal line and the data line is 10% or less of a width of the data line.

6. The display device of claim 5, further comprising:
   an initialization voltage line connected to the thin film transistor, the driving transistor, or the switching transistor,
   wherein a width of the lower metal line is the same as a width of overlap between the lower metal line and the initialization voltage line.

7. The display device of claim 6, wherein the width of the lower metal line is 2.4 μm or more.

8. The display device of claim 6, further comprising:
   a light emitting line extending along a second direction crossing the first direction,
   wherein the thin film transistor is connected to the driving transistor,
   wherein each of the plurality of sub-pixels further includes an additional switching transistor connected to the light emitting line and connected to the first electrode of the driving transistor, and
   wherein a separation distance between a channel of the additional switching transistor and the lower metal line is 50% or more of the width of the lower metal line.

9. The display device of claim 8, wherein, the lower metal line extends outward from the gate electrode of the driving transistor, and
   wherein the width of the lower metal line extended outward from the gate electrode of the driving transistor is smaller than the separation distance between the channel of the first additional switching transistor and the lower metal line, and is greater than 50% of the width of the lower metal line.

10. The display device of claim 3, further comprising:
    a light emitting line extending along a first direction,
    wherein the thin film transistor further includes an additional switching transistor connected to the driving transistor, the thin film transistor having a gate electrode connected to the light emitting line and the thin film transistor being connected to the second electrode of the driving transistor, and
    wherein the lower metal line overlaps the additional switching transistor in a thickness direction and does not overlap the channel of the driving transistor.

11. The display device of claim 10, further comprising:
    a scan line extending along the first direction,
    wherein the thin film transistor further includes a second switching transistor having a first electrode connected to a gate electrode of the driving transistor, and a gate electrode connected to the scan line, and
    wherein a separation distance between a channel of the second switching transistor and the lower metal line is -10% to 10% of a width of the lower metal line.

12. The display device of claim 3, further comprising:
    a scan line extending along a first direction,
    wherein the thin film transistor further includes an additional switching transistor having a first electrode connected to a second electrode of the driving transistor, and a gate electrode connected to the scan line,
    wherein a channel of the additional switching transistor overlaps the lower metal line, and
    wherein a channel of the driving transistor does not overlap the lower metal line.

13. The display device of claim 3, further comprising:
    a scan line extending along a first direction,
    wherein the thin film transistor further includes an additional switching transistor having a second electrode connected to a connection electrode through a contact hole, and a gate electrode connected to the scan line,
    wherein a channel of the additional switching transistor overlaps the lower metal line, and
    wherein a channel of the driving transistor does not overlap the lower metal line.

14. A display device, comprising:
    a base substrate including a display area, including a plurality of sub-pixels, and a non-display area surrounding the display area;
    a lower metal line disposed on the base substrate and surrounding at least a portion of the display area; and
    a gate layer disposed on the lower metal line,
    wherein in the non-display area, the lower metal line does not overlap the gate layer, and
    wherein the lower metal line overlaps only one of a channel of a driving transistor and a channel of a switching transistor.

15. The display device of claim 14, wherein the display area has a rectangular shape including a pair of long sides and a pair of short sides,
    wherein a driver is adjacent to a long side of the display area in the non-display area,
    wherein the gate layer includes a scan line passing through one of the plurality of sub-pixels and extending in a first direction,
    wherein the driver is connected to the one of the plurality of sub-pixels through a scan connection line, and
    wherein the scan connection line crosses the lower metal line while being electrically separated therefrom.

16. The display device of claim 15, further comprising:
a data metal layer disposed on the gate layer,
wherein the scan connection line includes a first scan connection line connected to the driver, a second scan connection line connected to the scan line, and a third scan connection line connecting the first scan connection line to the second scan connection line,
wherein the third scan connection line is included in the data metal layer, and
wherein the first and second scan connection lines are included in the gate layer.

17. The display device of claim 16, wherein the gate layer further includes an initialization voltage line passing through the pixel and extending along the first direction,
wherein an initialization bus line is disposed on the first data metal layer and the initialization bus line includes a first initialization bus line extending along a second direction crossing the first direction and disposed between the driver and the lower metal line, and a second initialization bus line connected to the first initialization bus line and extending along the first direction,
wherein the second initialization bus line is connected to the initialization voltage line, and
wherein the second initialization bus line crosses the lower metal line.

18. The display device of claim 17, wherein a first driving voltage line, and a data line are disposed on the data metal layer and the first driving voltage line and the data line extend along the second direction and are connected to the pixel, and
wherein each of the first driving voltage line and the data line overlaps the lower metal line in a thickness direction.

19. The display device of claim 18, wherein the non-display area further includes a bending area,
wherein a fan-out line is connected to the data line, and a signal input line is connected to the driver, and
wherein the lower metal line is disposed between the signal input line and the fan-out line and between the bending area and the display area.

20. The display device of claim 19, wherein the lower metal line includes a first lower metal portion located between the bending area and the display area, and a second lower metal portion passing through the bending area and connected to the first lower metal portion, and
wherein the second lower metal portion is disposed on the data metal layer.

21. The display device of claim 20, wherein the non-display area includes a pad area, and
wherein the second lower metal portion is configured to receive a constant voltage from a lower metal pad located in the pad area.

22. The display device of claim 21, wherein on a lower side of the bending area, the signal input line crosses the second lower metal portion.

23. The display device of claim 22, further comprising:
a second driving voltage line connected to a cathode electrode of the pixel,
wherein the second driving voltage line is disposed on the data metal layer, and
wherein the second driving voltage line covers the signal input line between the bending area and the display area.

24. A display device, comprising:
a substrate including a display area and a non-display area adjacent thereto;
a plurality of sub-pixels disposed within the display area, each of the plurality of sub-pixels including a driving transistor and a switching transistor; and
a lower metal line on the base substrate and surrounding the display area,
wherein the lower metal line overlaps the driving transistor or the switching transistor, but not both.

25. The display device of claim 24, wherein the lower metal line overlaps a channel of the driving transistor or a channel of the switching transistor, but not both.

* * * * *